US012774513B2

(12) United States Patent
Moon et al.

(10) Patent No.: US 12,774,513 B2

(45) Date of Patent: Oct. 27, 2026

(54) MASK ASSEMBLY, APPARATUS OF MANUFACTURING THE SAME, METHOD OF REPAIRING THE MASK ASSEMBLY, AND METHOD OF MANUFACTURING THE MASK ASSEMBLY

(71) Applicant: Samsung Display Co., Ltd., Yongin-si (KR)

(72) Inventors: Youngmin Moon, Yongin-si (KR); Youngho Park, Yongin-si (KR); Junho Jo, Yongin-si (KR); Arong Kim, Yongin-si (KR); Heemin Park, Yongin-si (KR); Areum Lee, Yongin-si (KR); Sungsoon Im, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 480 days.

(21) Appl. No.: 18/329,662

(22) Filed: Jun. 6, 2023

(65) Prior Publication Data

US 2024/0035145 A1 Feb. 1, 2024

(30) Foreign Application Priority Data

Jul. 26, 2022 (KR) ........................ 10-2022-0092699

(51) Int. Cl.
*C23C 14/04* (2006.01)
*C23C 16/04* (2006.01)

(52) U.S. Cl.
CPC .......... *C23C 14/042* (2013.01); *C23C 16/042* (2013.01)

(58) Field of Classification Search
CPC ............................ C23C 14/042; C23C 16/042
USPC .......................................................... 118/720
See application file for complete search history.

(56) References Cited

U.S. PATENT DOCUMENTS

| | | | | |
|---|---|---|---|---|
| 8,828,856 | B2 * | 9/2014 | Sonoda | H10K 59/122 427/248.1 |
| 12,416,072 | B2 * | 9/2025 | Jo | B23K 26/40 |
| 12,428,717 | B2 | 9/2025 | Son et al. | |
| 2007/0065571 | A1 | 3/2007 | White et al. | |
| 2013/0186335 | A1 * | 7/2013 | Kawato | C23C 14/12 118/720 |
| 2022/0010421 | A1 | 1/2022 | Moon et al. | |
| 2023/0068722 | A1 * | 3/2023 | Moon | B23K 26/38 |
| 2024/0011143 | A1 * | 1/2024 | Lee | C23C 14/24 |

FOREIGN PATENT DOCUMENTS

| | | | | | |
|---|---|---|---|---|---|
| CN | 204221303 | U | * | 3/2015 | |
| KR | 20070032608 | A | | 3/2007 | |
| KR | 20190048120 | A | | 5/2019 | |
| KR | 20200009799 | A | * | 1/2020 | H01L 51/56 |

(Continued)

*Primary Examiner* — Charlee J. C. Bennett
(74) *Attorney, Agent, or Firm* — CANTOR COLBURN LLP

(57) ABSTRACT

A mask assembly manufacturing apparatus includes a stage and a tensioner. A preliminary mask assembly including an open mask including a first opening and a second opening and a frame connected to the open mask disposed on the stage. The tensioner tensions a unit mask including a cell area including deposition openings and a holding area extending from the cell area, in a first direction. The cell area has a first width parallel to the first direction and a second width parallel to the second direction intersecting the first direction and greater than the first width.

17 Claims, 28 Drawing Sheets

(56) References Cited

FOREIGN PATENT DOCUMENTS

| | | | |
|---|---|---|---|
| KR | 10-2087731 | | 3/2020 |
| KR | 20200063638 | A | 6/2020 |
| KR | 20200070465 | A | 6/2020 |
| KR | 10-2022-0006152 | | 1/2022 |
| KR | 10-2357803 | | 2/2022 |
| KR | 20220034993 | A | 3/2022 |

* cited by examiner

MASK ASSEMBLY, APPARATUS OF MANUFACTURING THE SAME, METHOD OF REPAIRING THE MASK ASSEMBLY, AND METHOD OF MANUFACTURING THE MASK ASSEMBLY

CROSS-REFERENCE TO RELATED APPLICATION(S)

This application claims priority to and benefits of Korean Patent Application No. 10-2022-0092699 under 35 U.S.C. § 119, filed in the Korean Intellectual Property Office on Jul. 26, 2022, the entire contents of which are incorporated herein by reference.

BACKGROUND

1. Technical Field

The disclosure relates to a mask assembly, an apparatus of manufacturing the mask assembly, a method of repairing the mask assembly, and a method of manufacturing the mask assembly.

2. Description of the Related Art

A display device may be manufactured through various processes. For example, a deposition process may be used in the manufacturing process of the display device. In the deposition process to manufacture the display device, a fine metal mask (FMM), which is adhered to a substrate for the deposition of an organic material, is used. In order to adhere the fine metal mask to the substrate, the fine metal mask is coupled first to the frame. The fine metal mask is fixed to the frame by welding a wing portion coupled to an outer side of the fine metal mask to the frame. Before fixing the mask and the wing portion to the frame, it is necessary to align the fine metal mask first, however, it may not be limited thereto. A cell unit mask may be able to be used in the deposition process to manufacture the display device instead of the fine metal mask.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a mask assembly including a unit mask with an improved degree of freedom for proportion or shape.

The disclosure provides an apparatus of manufacturing the mask assembly including the unit mask with the improved degree of freedom for proportion or shape.

The disclosure provides a method of manufacturing the mask assembly including the unit mask with the improved degree of freedom for proportion or shape.

The disclosure provides a method of repairing the mask assembly with increased efficiency of production facility.

Embodiments provide an apparatus of manufacturing a mask assembly may include a stage and a tensioner. A preliminary mask assembly may include an open mask including a first opening and a second opening and a frame connected to the open mask disposed on the stage. The tensioner tensions a unit mask, which may include a cell area including deposition openings and a holding area extending from the cell area, in a first direction. The cell area has a first width parallel to the first direction and a second width parallel to the second direction intersecting the first direction and greater than the first width.

The tensioner may include a first chuck extending in the second direction; and a second chuck extending in the second direction and spaced apart from the first chuck in the first direction.

The apparatus may further include a vacuum pump connected to the first chuck and the second chuck.

Each of the first chuck and the second chuck may include a suction-holding part and a connection part connecting the suction-holding part and the vacuum pump. The suction-holding part may include a vacuum pressure distribution space defined therein and connected to the vacuum pump and suction holes extending from the vacuum pressure distribution space and defined in a lower surface of the suction-holding part.

The open mask may include an edge portion corresponding to the frame and an intermediate portion extending from the edge portion and disposed between the first opening and the second opening of the open mask, and the stage may include a fixing part that fixes the intermediate portion.

The fixing part may include a first fixing part and a second fixing part, the first fixing part overlaps the intermediate portion in a plan view, the second fixing part overlaps the second opening of the open mask in a plan view, and the second fixing part is turned off in case that the first fixing part is turned on.

Each of the first fixing part and the second fixing part may extend in the second direction, and the first fixing part and the second fixing part may be spaced apart from each other in the first direction.

The apparatus may further include a first gantry connected to the tensioner; and a first laser part connected to the first gantry. The first gantry and the tensioner may move to allow the cell area of the unit mask to overlap the first opening of the open mask in a plan view.

The apparatus may further include a second gantry spaced apart from the first gantry in the first direction; and a second laser part connected to the second gantry. One of the first laser part and the second laser part welds the unit mask to the open mask, and the other of the first laser part and the second laser part cuts the holding area of the unit mask.

At least one of the first laser part and the second laser part may remove a welding point or a residue of the welding point remaining in the open mask.

The apparatus may further include a dust suction part connected to the second gantry.

The apparatus may further include a camera part connected to the second gantry.

Embodiments provide a method of manufacturing a mask assembly. The manufacturing method may include placing a preliminary mask assembly including an open mask including a first opening and a second opening and a frame combined with the open mask on a stage; placing a unit mask including a cell area including deposition openings and a holding area adjacent to the cell area in a first direction on the first opening of the open mask; and welding the unit mask to the open mask. The holding area may include a first long side area and a second long side area spaced apart from the first long side area with the cell area disposed between the first long side area and second long side area in the first direction, and a tensioner contacts the first long side area and the second long side area to apply a tensile force to the unit mask in a direction that the first long side area and the second long side area move away from each other in the placing of the unit mask.

The open mask may include an edge portion corresponding to the frame and an intermediate portion extending from the edge portion and disposed between the first opening and the second opening, and the stage may include a first fixing part overlapping the intermediate portion in a plan view and a second fixing part overlapping the second opening of the open mask in a plan view.

The placing of the preliminary mask assembly may include fixing the intermediate portion using the first fixing part that is turned on while the second fixing part is turned-off.

The welding of the unit mask to the open mask may include irradiating a laser beam to an area overlapping the intermediate portion of the open mask between the first long side area contacting the tensioner and the first opening of the open mask using a laser part in a plan view to form a first welding point; and irradiating a laser beam to an area overlapping the edge portion of the open mask between the second long side area contacting the tensioner and the first opening of the open mask using the laser part in a plan view to form a second welding point.

The manufacturing method may further include cutting a portion of the unit mask. The cutting of the portion of the unit mask may include irradiating a laser beam to an area between the first long side area contacting the tensioner and the first welding point using the laser part; and irradiating a laser beam to an area between the second long side area contacting the tensioner and the second welding point using the laser part.

The manufacturing method may further include repairing the mask assembly. The repairing of the mask assembly may include removing a first welding point and a second welding point using a laser part; separating the unit mask from the open mask; placing a replacement unit mask on the open mask; and welding the replacement unit mask to an area of the open mask spaced apart from areas of the open mask from which the first welding point and the second welding point are removed.

Embodiments provide a method of repairing a mask assembly. The repairing method may include preparing a mask assembly including a frame including a frame opening, an open mask covering the frame opening and including openings, and unit masks each connected to the open mask by welding points and corresponding to the openings; removing the welding points of a defective unit mask among the unit masks using a laser part; separating the defective unit mask from the open mask; placing a replacement unit mask in an opening from which the defective unit mask is removed among the openings of the open mask; and welding the replacement unit mask to an area spaced apart from the areas from which the welding points are removed to combine the replacement unit mask with the open mask.

Embodiments provide a mask assembly including a frame including a frame opening; an open mask covering the frame opening, and including a first opening and a second opening, and including an edge portion corresponding to the frame and an intermediate portion extending from the edge portion and disposed between the first opening and the second opening; and a unit mask including a cell area overlapping the first opening in a plan view and deposition openings. The cell area has a first width parallel to a first direction and a second width parallel to a second direction intersecting the first direction and greater than the first width, and the unit mask and the open mask are connected to each other by welding points disposed in the second direction.

The cell area of the unit mask is connected to the open mask while being tensioned in a range of about 0.01% to about 0.03% in the first direction.

The welding points do not overlap an edge of a short side extending in the first direction of the unit mask in a plan view.

The open mask may further include a third opening, the second opening is spaced apart from the first opening in the first direction, and the third opening is spaced apart from the first opening in the second direction.

According to the above, in the process of coupling the unit mask with the open mask, the mask assembly is manufactured by coupling the unit mask with the open mask using a two-sides tension in which the unit mask is tensioned only in the first direction or only in the second direction rather than using a four-sides tension in which the unit mask is tensioned in both the first direction and the second direction. In case that compared with the four-sides tension, a tensile force required in the two-sides tension of the unit mask is reduced by about ten times based on the same tensile rate, and thus, a reaction force is reduced. An alignment error outside the cell area of the unit mask, for example, a pixel position accuracy (PPA), is up to about 0.3 micrometers in the tensile direction, and thus, the alignment error is reduced in the two-sides tension compared with the four-sided tension. Accordingly, in case that the mask assembly manufactured according to the disclosure is used, a reliability in deposition is improved.

Since the unit mask is coupled while being tensioned in two-sides in a cell unit, the open mask is able to include openings arranged in multiple rows or multiple columns regardless of a direction in which the unit mask is tensioned. For example, the mask assembly including the unit masks with a variety of proportions or a variety of shapes is formed. As an example, a mask assembly for manufacturing display devices meets the needs for the integration of an automobile instrument panel and a navigation unit with a ratio of 10 to 1. As the mask assembly that may include the unit masks arranged in multiple rows or multiple columns is formed, the manufacturing cost is reduced and an efficiency of the production equipment increases.

According to the above, the mask assembly manufacturing apparatus is used to repair the unit mask, and thus, the mask assembly manufacturing apparatus is able to replace a separate device for repairing the unit mask.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
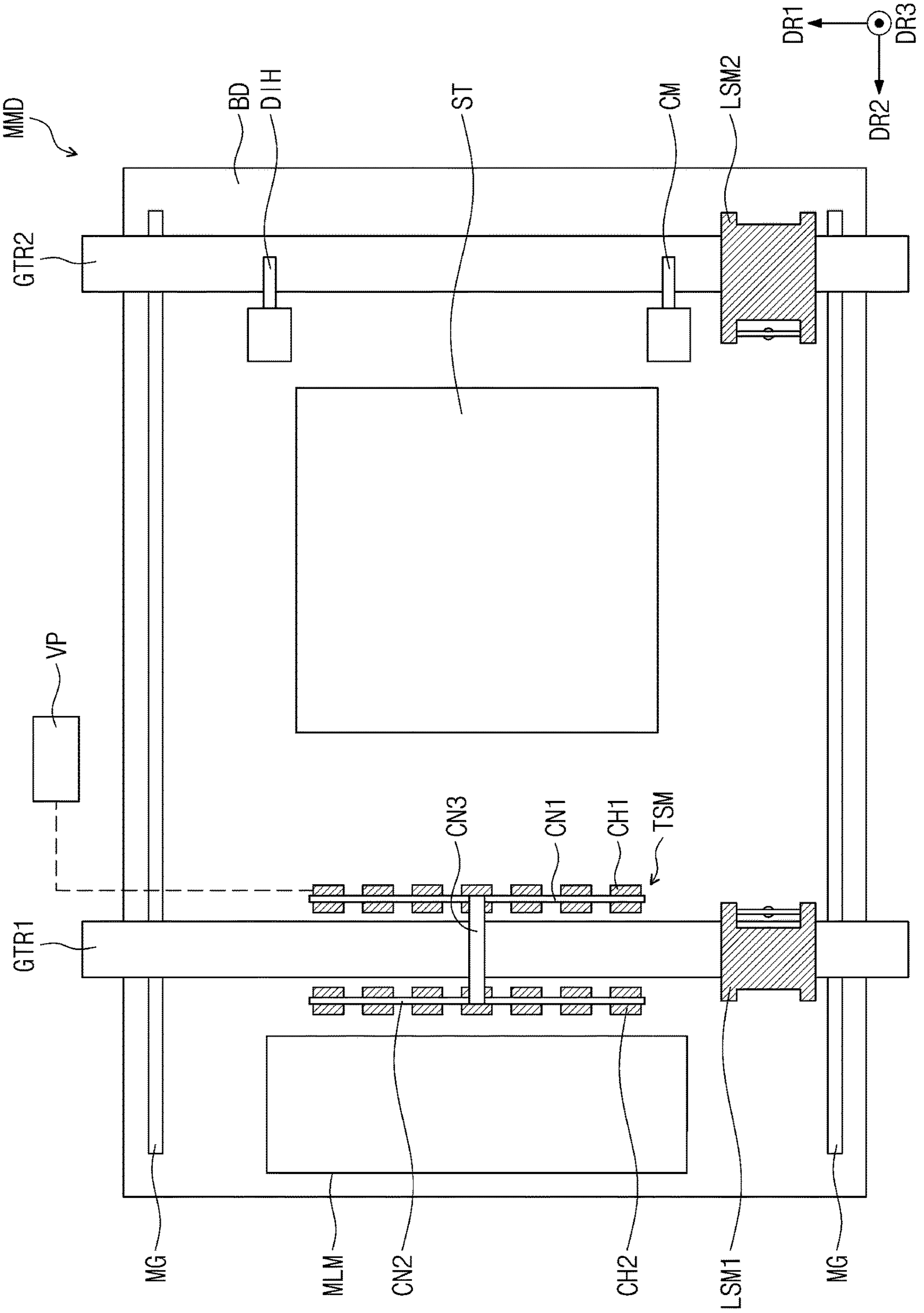
FIG. 1 is a schematic plan view of an apparatus of manufacturing a mask assembly according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

It will be understood that the terms "connected to" or "coupled to" may include a physical or electrical connection or coupling.

Like numerals refer to like elements throughout. In the drawings, the thickness, ratio, and dimension of components are exaggerated for effective description of the technical content.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure.

As used herein, the singular forms, "a", "an" and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

Spatially relative terms, such as "beneath", "below", "lower", "above", "upper" and the like, may be used herein for ease of description to describe one element or feature's relationship to another elements or features as shown in the figures.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms including technical and scientific terms used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined or implied herein.

Hereinafter, embodiments of the disclosure will be described with reference to accompanying drawings.

FIG. 1 is a schematic plan view of an apparatus MMD (hereinafter, referred to as a mask assembly manufacturing apparatus) of manufacturing a mask assembly according to an embodiment.

Referring to FIG. 1, the mask assembly manufacturing apparatus MMD may be used to manufacture a process mask MS (hereinafter, referred to as a mask assembly, refer to FIG. 9) for a display device in a deposition process of a manufacturing process of the display device. In more detail, the mask assembly manufacturing apparatus MMD may be used to manufacture the mask assembly MS adhered to a substrate for the deposition process. The mask assembly MS may include a fine metal mask (FMM) or an open mask (OM).

The mask assembly manufacturing apparatus MMD may include a body portion BD, a stage ST, a movement guide MG, a first gantry GTR1, a first laser unit (or first laser part) LSM1, a tensioner TSM, a vacuum pump VP, a second gantry GTR2, a second laser unit (or second lase part) LSM2, a dust suction unit (or dust section part) DIH, a camera unit (or camera part) CM, and a mask loading unit (or mask loading part) MLM.

The body portion BD may support the stage ST and the mask loading unit MLM. The body portion BD may have a rectangular shape, however, the shape of the body portion BD should not be limited to the rectangular shape.

A process of manufacturing the mask assembly MS may be performed on the body portion BD. A unit mask MST (refer to FIG. 4) may be a cell mask provided in a cell unit. However, the type of the unit mask MST should not be limited thereto or thereby, and the mask assembly manufacturing apparatus MMD may be used to combine the unit mask MST for other uses and a preliminary mask assembly MS_P (refer to FIG. 3A) for other uses.

The stage ST may be disposed on the body portion BD. The stage ST may have a quadrangular shape in case that viewed in a plan view. The stage ST may be formed of aluminum (Al) and/or quartz, however, the shape and the material of the stage ST should not be limited thereto or thereby.

The movement guide MG may extend in a second direction DR2 above the body portion BD. In an embodiment, two movement guides MG may be provided. The two movement guides MG may be arranged (or disposed) in a first direction DR1 and may be spaced apart from each other. The first gantry GTR1 and the second gantry GTR2 may move in the second direction DR2 along the movement guide MG.

Directions indicated by the first to third directions DR1, DR2, and DR3 are relative, and may include different directions.

The first gantry GTR1 may be coupled (or connected) with the first laser unit LSM1 and the tensioner TSM. The first gantry GTR1 may move the first laser unit LSM1 and the tensioner TSM along a direction substantially parallel to the second direction DR2. The first gantry GTR1 may move by the movement guide MG, however, it should not be limited thereto or thereby. As an example, the first gantry GTR1 may move along the direction substantially parallel to the second direction DR2 using a separate driving device and a guide device.

The first laser unit LSM1 may be coupled with the first gantry GTR1. The first laser unit LSM1 may include a laser module (not shown) and an optical system (not shown). The first laser unit LSM1 may move in a direction substantially parallel to the first direction DR1 above the first gantry GTR1. The first laser unit LSM1 may remove the unit mask MST from the preliminary mask assembly MS_P (refer to FIG. 3A) or may cut a portion of the unit mask MST. The first laser unit LSM1 may irradiate a laser beam with a wavelength band in a range of picoseconds (ps) to femtoseconds (fs) or a laser beam with a wavelength band in a range of milliseconds (ms) to nanoseconds (ns) to smoothly cut the unit mask MST.

The tensioner TSM may be coupled with the first gantry GTR1. The tensioner TSM may move in the direction parallel to the first direction DR1 above the first gantry GTR1. The tensioner TSM may move in a direction parallel to a third direction DR3. The tensioner TSM may tension the unit mask MST (refer to FIG. 4) in the second direction DR2. To this end, the tensioner TSM may include a first chuck CH1 and a second chuck CH2. The first chuck CH1 and the second chuck CH2 may be arranged in the second direction DR2 and may be spaced apart from each other. Each of the first chuck CH1 and the second chuck CH2 may suction-hold the unit mask MST. In more detail, each of the first chuck CH1 and the second chuck CH2 may suction-hold an upper surface of the unit mask MST using a vacuum pressure. To this end, each of the first chuck CH1 and the second chuck CH2 may be connected to the vacuum pump VP.

Each of the first chuck CH1 and the second chuck CH2 may pull the suction-held unit mask MST and may tension the suction-held unit mask MST in the direction parallel to the second direction DR2. In detail, the first chuck CH1 may move in a direction opposite to the second direction DR2 while suction-holding the unit mask MST, and the second chuck CH2 may move in the second direction DR2 while suction-holding the unit mask MST, and thus, the unit mask MST may be tensioned.

Each of the first chuck CH1 and the second chuck CH2 may be provided in plural. Each of the first chucks CH1 and the second chucks CH2 may be arranged in the first direction DR1 and may be spaced apart from each other. The first chucks CH1 may be connected to each other by a first connection unit CN1, and the second chucks CH2 may be connected to each other by a second connection unit CN2. The first connection unit CN1 and the second connection unit CN2 may be connected to each other by a third connection unit CN3. The first connection unit CN1 and the second connection unit CN2 may be spaced apart from each other with the first gantry GTR1 interposed therebetween in the second direction DR2. The third connection unit CN3 may connect the first chucks CH1 and the second chucks CH2 to the first gantry GTR1. FIG. 1 shows seven first chucks CH1 and seven second chucks CH2, however, the number of the first chucks CH1 and the number of the second chucks CH2 should not be limited thereto or thereby.

The vacuum pump VP may be connected to the first chuck CH1 and the second chuck CH2. The vacuum pump VP may provide a vacuum pressure to the first chuck CH1 and the second chuck CH2. The first chuck CH1 and the second chuck CH2 may suction-hold the unit mask MST using the vacuum pressure provided from the vacuum pump VP.

The second gantry GTR2 may be coupled with the second laser unit LSM2, the dust suction unit DIH, and the camera unit CM. The second gantry GTR2 may move the dust suction unit DIH, the camera unit CM, and the second laser unit LSM2 in the direction parallel to the second direction DR2. The second gantry GTR2 may move by the movement guide MG, however, it should not be limited thereto or thereby. For example, the second gantry GTR2 may move along the direction substantially parallel to the second direction DR2 using a separate driving device and a guide device.

The second laser unit LSM2 may be coupled with the second gantry GTR2. The second laser unit LSM2 may include a laser module (not shown) and an optical system (not shown). The second laser unit LSM2 may move in the direction parallel to the first direction DR1 above the second gantry GTR2. The second laser unit LSM2 may weld the unit mask MST onto the preliminary mask assembly MS_P (refer to FIG. 3A). The wavelength bands of the laser irradiated by the second laser device LSM2 may be different from the wavelength bands of the laser irradiated by the first laser device LSM1. As an example, the second laser unit LSM2 may irradiate a laser beam with a wavelength band in a range of picoseconds (ps) to femtoseconds (fs) or a laser beam with a wavelength band in a range of milliseconds (ms) to nanoseconds (ns).

One of the first laser unit LSM1 and the second laser unit LSM2 may weld the unit mask MST to the open mask OM (refer to FIG. 3A) of the preliminary mask assembly MS_P, and the other of the first laser unit LSM1 and the second laser unit LSM2 may cut a holding area HA (refer to FIG. 4) of the unit mask MST. At least one of the first laser unit LSM1 and the second laser unit LSM2 may remove welding points WE1 and WE2 (refer to FIG. 6D) or residues of the welding points, which remain on the open mask OM.

As an example, the first laser unit LSM1 may perform a process of welding the unit mask MST to the open mask OM of the preliminary mask assembly MS_P. A first laser beam LS1 emitted from the first laser unit LSM1 may have a wavelength band in a range of milliseconds (ms) to nanoseconds (ns). The second laser unit LSM2 may perform a process of cutting the holding area HA of the unit mask MST and a process of removing the welding points WE1 and WE2 or the residues of the welding points, which remain on the open mask OM. A second laser beam LS2 emitted from the second laser unit LSM2 may have a wavelength band in a range of picoseconds (ps) to femtoseconds (fs). However, processes performed by the first laser unit LSM1 and the second laser unit LSM2 should not be limited thereto or thereby, and the first laser unit LSM1 and the second laser unit LSM2 may operate differently according to the process of manufacturing the mask assembly MS. As an example, the first laser unit LSM1 and the second laser unit LSM2 may perform a process of separating the unit mask MST from the preliminary mask assembly MS_P.

The dust suction unit DIH may be coupled with the second gantry GTR2. The dust suction unit DIH may move in the direction parallel to the first direction DR1 above the second gantry GTR2. The dust suction unit DIH may suction dust generated in case that the first laser unit LSM1 cuts the portion of the unit mask MST.

The camera unit CM may be coupled with the second gantry GTR2. The camera unit CM may move in the direction parallel to the first direction DR1 above the second gantry GTR2. The camera unit CM may check a pixel position accuracy (PPA) and an alignment of the unit mask MST in real time. The tensioner TSM may be aligned with the unit mask MST based on the alignment state measured by the camera unit CM.

The mask loading unit MLM may be disposed on the body portion BD. The mask loading unit MLM may have a structure in which the unit mask MST is loaded.

Figure 2:
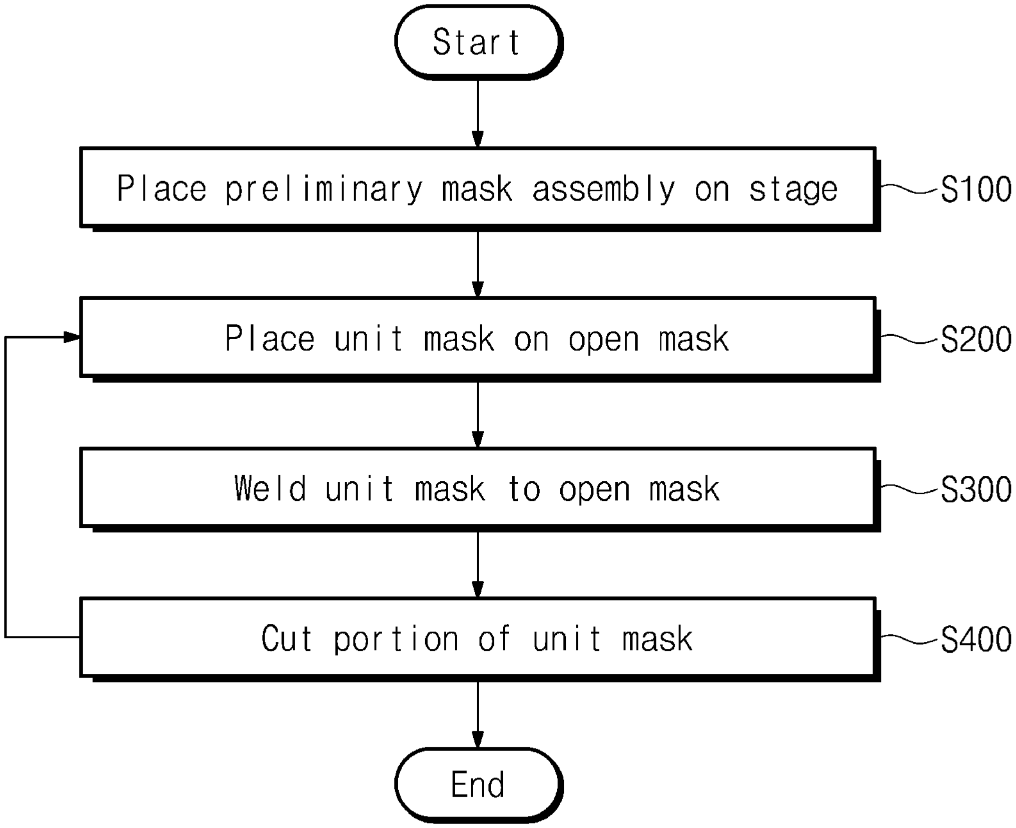
FIG. 2 is a flowchart of a method of manufacturing a mask assembly according to an embodiment.
Figure 3A:
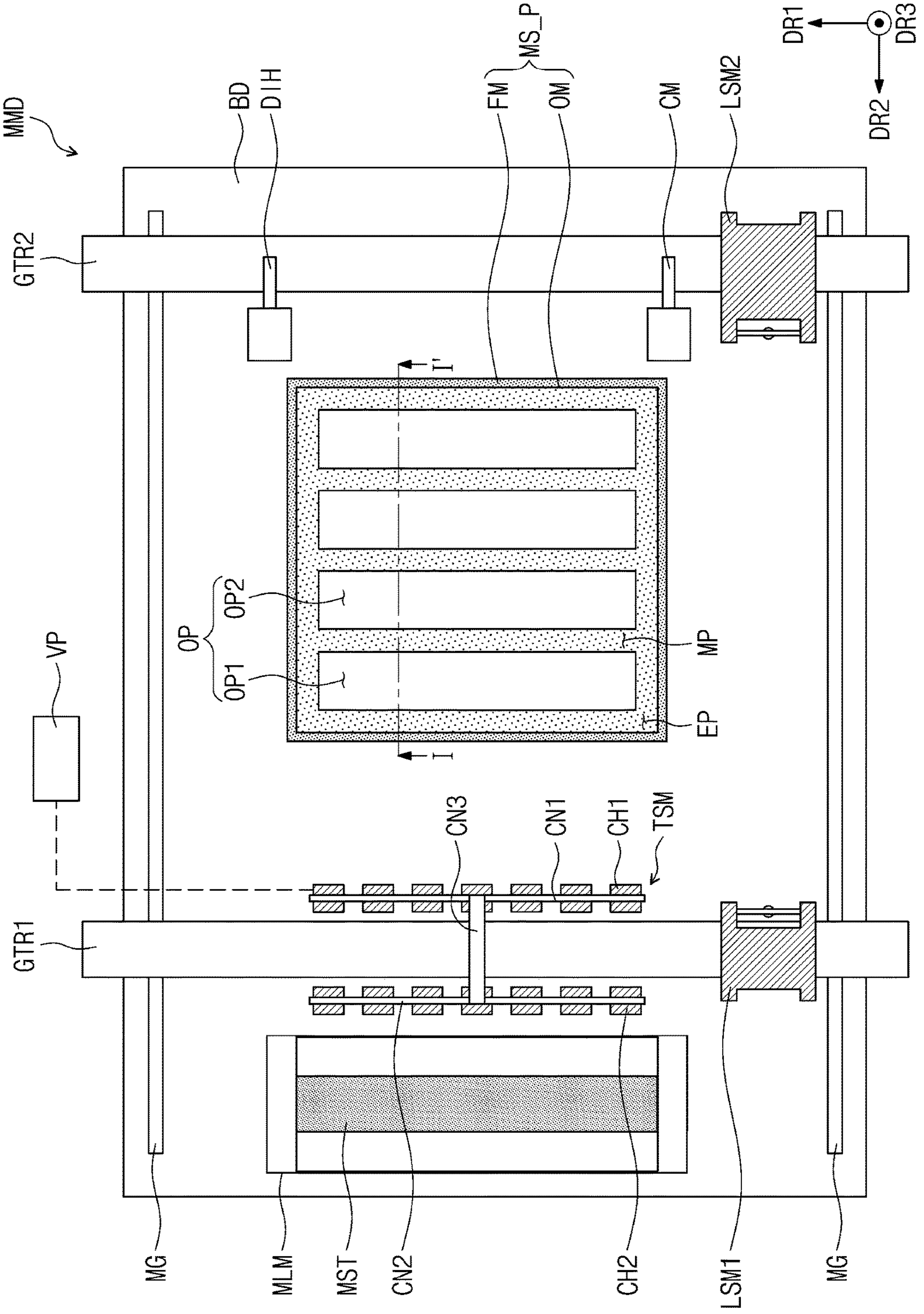
FIG. 3A is a schematic plan view to explain a process of the method of manufacturing the mask assembly according to an embodiment.
Figure 3B:
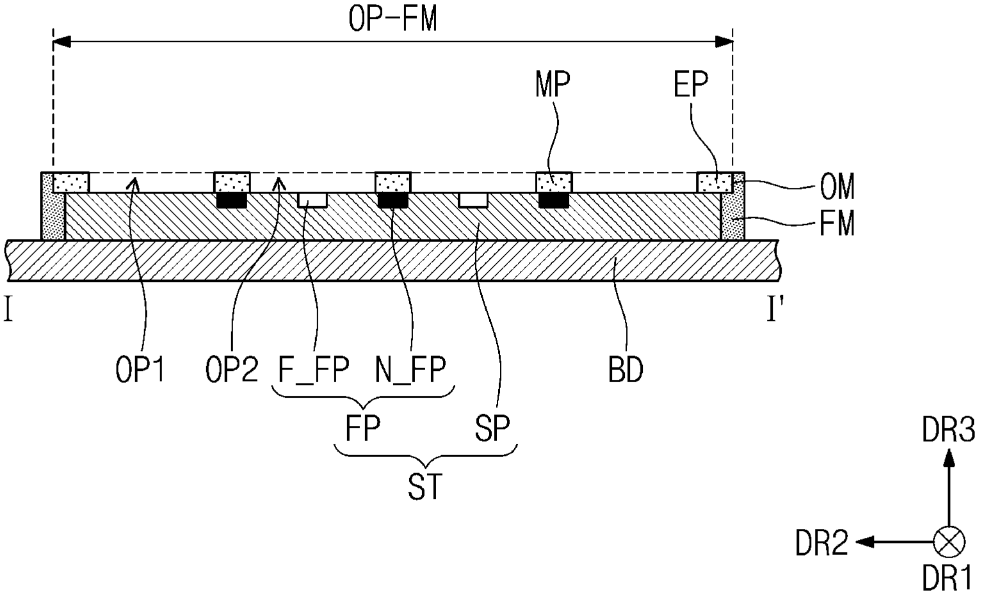
FIG. 3B is a schematic cross-sectional view taken along line I-I' of FIG. 3A.

FIG. 2 is a flowchart of a method of manufacturing the mask assembly according to an embodiment. FIG. 3A is a schematic plan view to explain a process of the method of manufacturing the mask assembly according to an embodiment. FIG. 3B is a schematic cross-sectional view taken along line I-I' of FIG. 3A.

Referring to FIGS. 2, 3A, and 3B, the preliminary mask assembly MS_P may be disposed on the stage ST on the body portion BD (S100). The preliminary mask assembly MS_P may include a frame FM and the open mask OM.

The frame FM may be provided with a frame opening OP-FM defined therethrough. The frame FM may surround the stage ST. The frame FM may contain a rigid material. As an example, the frame FM may contain SUS and/or Invar. The unit mask MST may be loaded on the mask loading unit MLM.

The open mask OM may cover the frame opening OP-FM and may be coupled with the frame FM. The open mask OM may contain a rigid material. As an example, the open mask OM may contain SUS and/or Invar. The open mask OM may be provided with openings OP defined therethrough. FIG. 3A shows the open mask OM through which four openings OP are defined. Hereinafter, a first opening OP1 and a second opening OP2 among the openings OP will be described.

The open mask OM may include an edge portion EP and an intermediate portion MP. The edge portion EP may correspond to the frame FM and may define an edge of the open mask OM. The intermediate portion MP may be disposed between the first opening OP1 and the second opening OP2.

The stage ST may include a support plate SP and a fixing unit (or fixing part) FP. The support plate SP may be disposed on the body portion BD and may provide a lower surface of the stage ST. The fixing unit FP may be disposed in the support plate SP. The fixing unit FP may fix the intermediate portion MP of the open mask OM disposed on the stage ST to a certain or given position. As an example, where the unit mask MST is tensioned and coupled with the open mask OM, an external force may act on the intermediate portion MP of the open mask OM by a tensile force applied to the unit mask MST. The fixing unit FP may fix the intermediate portion MP of the open mask OM to the certain or given position such that the intermediate portion MP may not be curved due to the external force.

The fixing unit FP may extend in the first direction DR1. The fixing unit FP may be provided in plural. The fixing units FP may be arranged in the second direction DR2 and may be spaced apart from each other. As the fixing unit FP is provided in plural, intermediate portions MP may be fixed. The fixing units FP may be individually operated. Where the open mask OM is disposed on the fixing units FP, only the fixing unit FP overlapping the open mask OM may be selectively operated. As an example, the fixing units FP may include a first fixing unit N_FP that is turned on and a second fixing unit F_FP that is turned off. The first fixing unit N_FP may overlap the intermediate portion MP of the open mask OM, and the second fixing unit F_FP may overlap the second opening OP2. The open mask OM may be fixed by the turned-on first fixing unit N_FP.

The fixing unit FP may include a magnet, a vacuum hole, and/or an electrostatic chuck (ESC). In case that the fixing unit FP is the magnet, the fixing unit FP may fix the intermediate portion MP of the open mask OM to the fixing unit FP by a magnetic coupling method. In case that the fixing unit FP is the vacuum hole, the fixing unit FP may fix the intermediate portion MP of the open mask OM disposed on the vacuum hole to the fixing unit FP using a vacuum pressure. In case that the fixing unit FP is the electrostatic chuck, the fixing unit FP may fix the intermediate portion MP of the open mask OM to the fixing unit FP using an electrostatic force.

FIG. 3B shows a structure in which the intermediate portion MP of the open mask OM is arranged on the fixing units while skipping one in every two fixing units as a representative example, however the arrangement of the intermediate portion MP of the open mask OM should not be limited thereto or thereby. As an example, where a width of the first opening OP1 or the second opening OP2 of the open mask OM is small, the intermediate portion MP of the open mask OM may be disposed on all the fixing units FP, and all the fixing units FP may be turned on.

Figure 4:
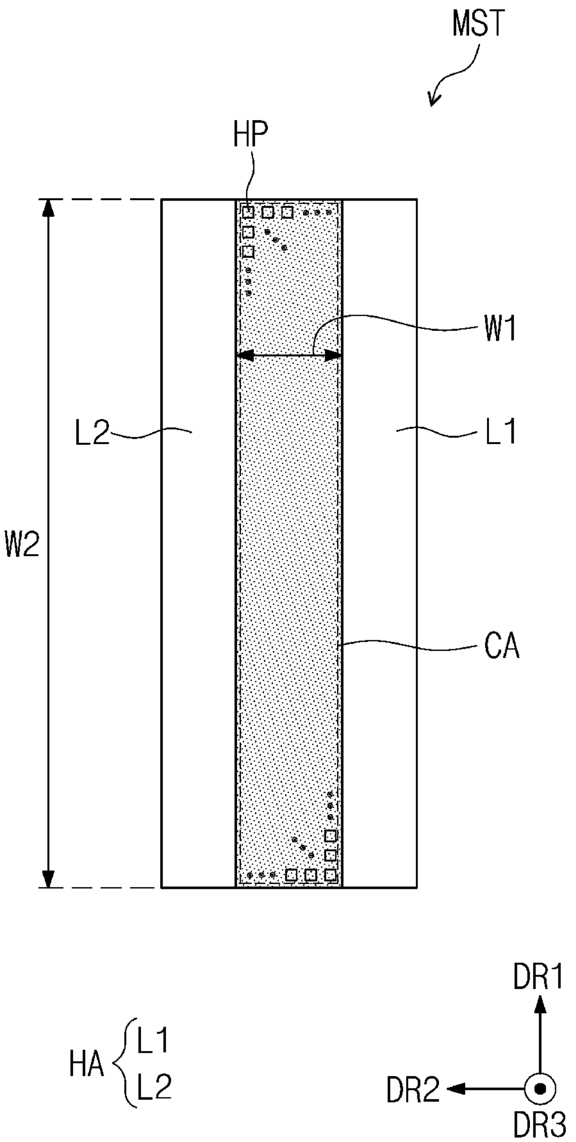
FIG. 4 is a view of a unit mask according to an embodiment.

FIG. 4 is a view of the unit mask MST according to an embodiment.

Referring to FIG. 4, the unit mask MST may include a cell area CA and the holding area HA extending from the cell area CA. The holding area HA may extend from the cell area CA to the direction parallel to the second direction DR2. The cell area CA may be an opening corresponding to a deposition pattern of a product. For example, one cell area CA may correspond to a deposition area of one product. Accordingly, the cell area CA may overlap the first opening OP1 (refer to FIG. 3A) or the second opening OP2 (refer to FIG. 3A) of the open mask OM (refer to FIG. 3A). However, the cell area CA should not be limited thereto or thereby, and the cell area CA may vary depending on the shape and the size of a product. As an example, the cell area CA may correspond to deposition areas of plural products, or the cell area CA may correspond to a portion of a deposition area of one product. For example, plural cell areas may correspond to the deposition area of one product.

The cell area CA may have a first width W1 in the direction parallel to the second direction DR2 and a second width W2 in the direction parallel to the first direction DR1. The first width W1 may be the largest width in the direction parallel to the second direction DR2, and the second width W2 may be the largest width in the direction parallel to the first direction DR1. The second width W2 may be greater than the first width W1. The unit mask MST may extend in the direction parallel to the first width W1, and the second width W2 may be substantially perpendicular to the direction in which the unit mask MST extends. For example, the direction parallel to the largest width of the unit mask MST may be substantially perpendicular to the direction in which the unit mask MST extends.

FIG. 4 shows the cell area CA having the quadrangular shape as a representative example, however, the shape of the cell area CA should not be limited to the quadrangular shape and may vary depending on the shape of a product. As an example, the cell area CA may have a variety of shapes such as a polygonal, circular, oval, or irregular shape.

Deposition openings HP may be defined in the cell area CA to correspond to the deposition pattern. A deposition material sprayed from a deposition source may be provided to the deposition openings HP in the deposition process, the deposition material may be deposited on a work substrate, and thus the deposition pattern corresponding to the deposition openings HP may be formed. The cell area CA may be coupled with the open mask OM while being tensioned in a range of about 0.01% to about 0.03% in the second direction DR2.

The holding area HA may be an area in contact with the tensioner TSM (refer to FIG. 1) in case that the unit mask MST is tensioned. The holding area HA may include a first long side area L1 and a second long side area L2. The first long side area L1 may extend from the cell area CA to a direction opposite to the second direction DR2, and the second long side area L2 may extend from the cell area CA to the second direction DR2. The first long side area L1 and the second long side area L2 may be spaced apart from each other with the cell area CA interposed therebetween in the second direction DR2. For example, the cell area CA may be disposed between the first long side area L1 and the second long side area L2. Each of the first long side area L1 and the second long side area L2 may include a material with a small thermal expansion coefficient. As an example, each of the first long side area L1 and the second long side area L2 may include Invar, however, it should not be limited thereto or thereby.

Figure 5A:
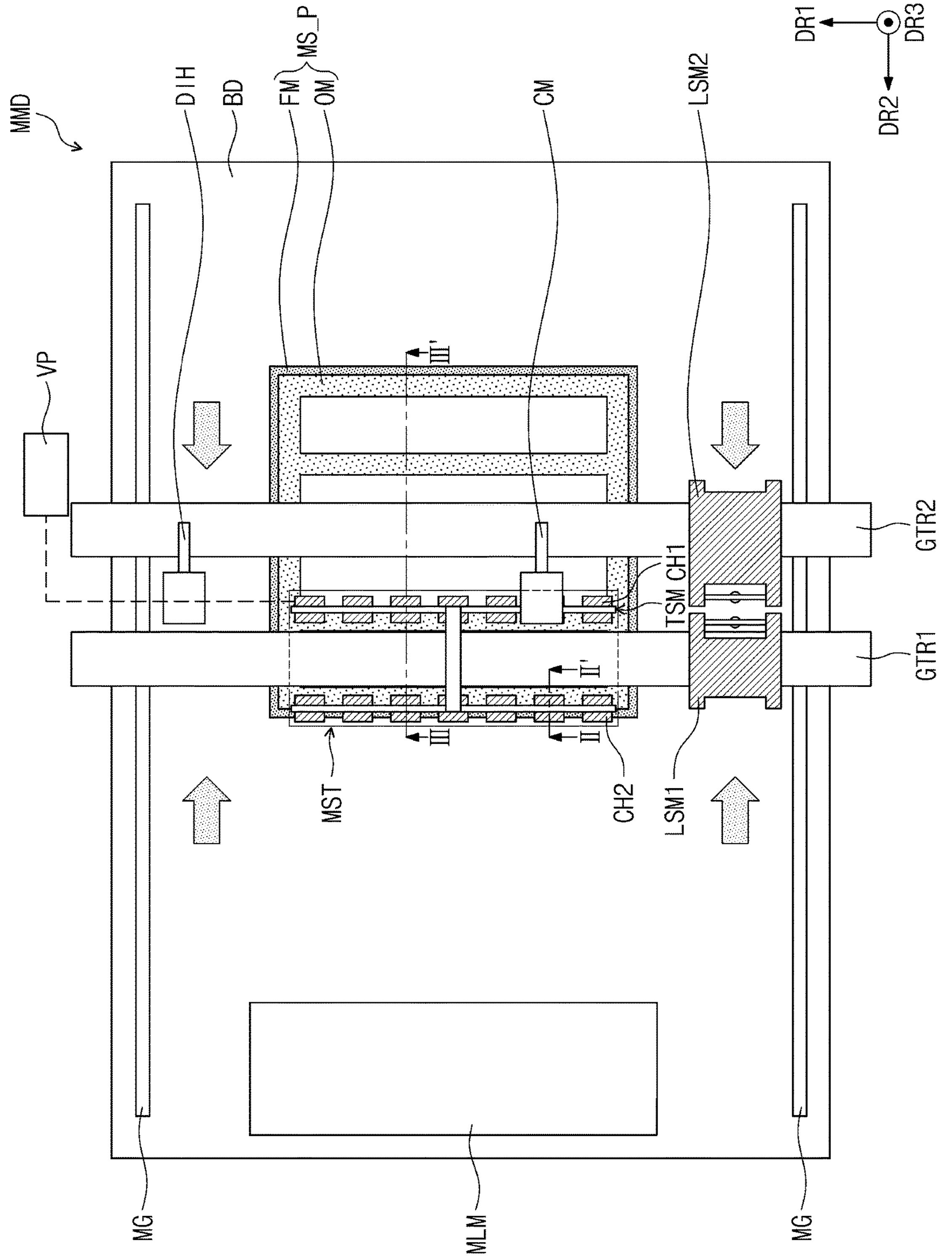
FIG. 5A is a schematic plan view to explain a process of the method of manufacturing the mask assembly according to an embodiment.
Figure 5B:
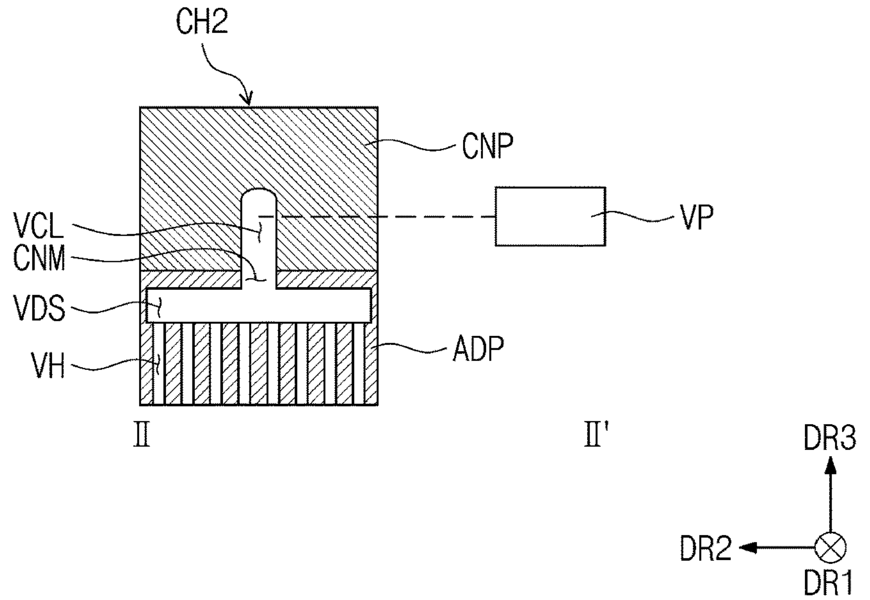
FIG. 5B is a schematic cross-sectional view taken along line II-II' of FIG. 5A.
Figure 5C:
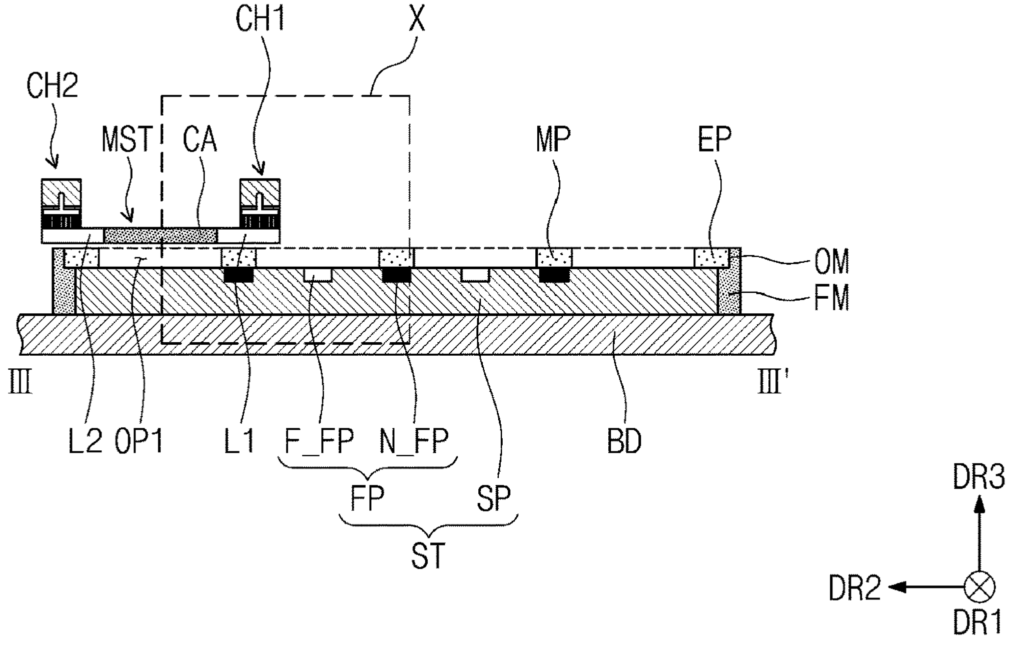
FIG. 5C is a schematic cross-sectional view taken along line III-III' of FIG. 5A.
Figure 5D:
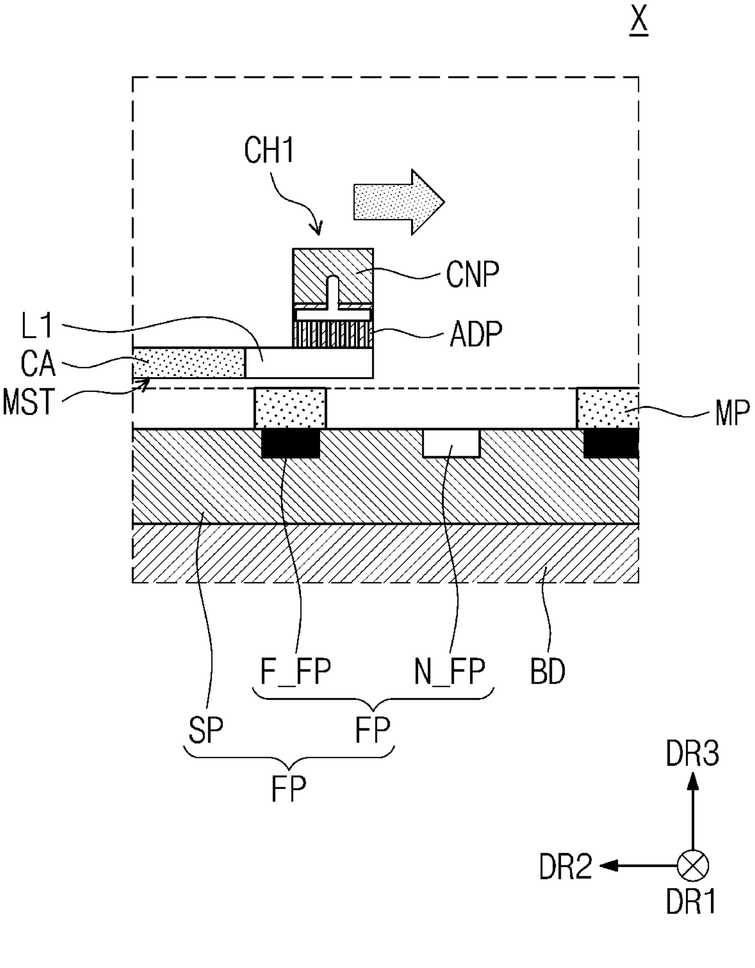
FIGS. 5D and 5E are enlarged views of a portion corresponding to an area X of FIG. 5C.
Figure 5E:
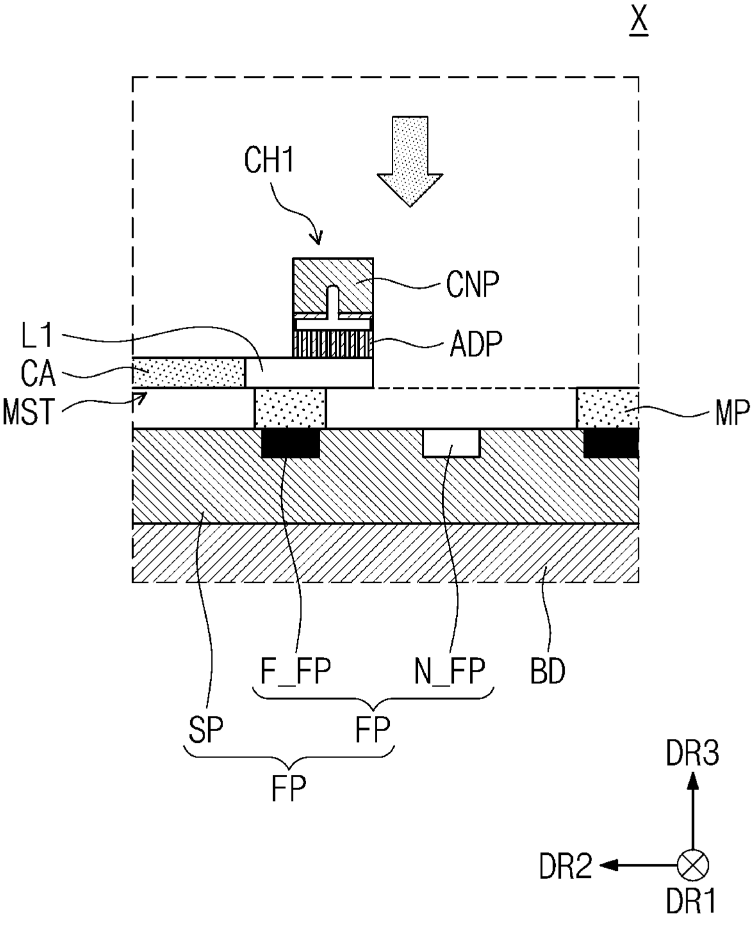

FIG. 5A is a schematic plan view to explain a process of the method of manufacturing the mask assembly according to an embodiment. FIG. 5B is a schematic cross-sectional view taken along line II-II' of FIG. 5A. FIG. 5C is a schematic cross-sectional view taken along line III-III' of FIG. 5A. FIGS. 5D and 5E are enlarged views of a portion corresponding to an area X of FIG. 5C.

Referring to FIGS. 2 and 5A, the unit mask MST may be disposed above the open mask OM (S200). The unit mask MST disposed on the mask loading unit MLM may move onto the open mask OM of the preliminary mask assembly MS_P using the tensioner TSM.

Referring to FIGS. 5A and 5C, the first gantry GTR1 and the tensioner TSM may move to allow the cell area CA of the unit mask MST to overlap the first opening OP1 of the open mask OM. The first gantry GTR1 may move in the direction parallel to the second direction DR2, and the tensioner TSM may move in the direction parallel to the first direction DR1 on the first gantry GTR1. Thus, the unit mask MST may move to a desired position.

The second gantry GTR2 may move in the direction parallel to the second direction DR2, and the camera unit CM may move in the direction parallel to the first direction DR1 on the second gantry GTR2. Accordingly, the camera unit CM may check the alignment of the unit mask MST at a certain or given position. The tensioner TSM may align the unit mask MST based on the alignment state measured by the camera unit CM.

The tensioner TSM may move the unit mask MST disposed on the mask loading unit MLM onto the open mask OM and may tension the unit mask MST. However, the order of the movement and the tension of the unit mask MST should not be limited thereto or thereby. As an example, the tensioner TSM may move the unit mask MST onto the open mask OM after tensioning the unit mask MST disposed on the mask loading unit MLM, or the tensioner TSM may tension the unit mask MST while moving the unit mask MST. In the following descriptions, the process sequence in which the unit mask MST first moves onto the open mask OM and the unit mask MST is tensioned will be described as a representative example, and descriptions on other process sequences may be omitted.

FIG. 5B shows a cross-section of the second chuck CH2, and a cross-section of the first chuck CH1 may be substantially the same as that of the second chuck CH2. Referring to FIG. 5B, the second chuck CH2 may include a suction-holding unit (or suction-holding part) ADP and a connection unit (or connection part) CNP.

The suction-holding unit ADP may include a vacuum pressure distribution space VDS, suction holes VH, and a connection hole CNM. The vacuum pressure distribution space VDS may be disposed in the suction-holding unit ADP and may be connected to the vacuum pump VP. The vacuum pressure distribution space VDS may extend in the second direction DR2.

The suction holes VH may extend from the vacuum pressure distribution space VDS and may be defined in a lower surface of the suction-holding unit ADP. Accordingly, the suction holes VH may be exposed through the lower surface of the suction-holding unit ADP. For example, the vacuum pressure distribution space VDS may be connected to the lower surface of the suction-holding unit ADP via the suction holes VH. The suction holes VH may be arranged in the second direction DR2 and may be spaced apart from each other. The lower surface of the suction-holding unit ADP may have a porous structure. The connection hole CNM may extend upward from the vacuum pressure distribution space VDS.

The connection unit CNP may connect the suction-holding unit ADP to the vacuum pump VP. The connection unit CNP may include a vacuum pressure connection passage VCL. The vacuum pressure connection passage VCL may connect the connection hole CNM to the vacuum pump VP.

Referring to FIGS. 5C and 5D, the first chuck CH1 may suction-hold the first long side area L1. In more detail, the first long side area L1 may be suction-held while a portion of an upper surface of the first long side area L1 is being in contact with the lower surface of the suction-holding unit ADP due to the vacuum pressure provided by the vacuum pump VP (refer to FIG. 5B). Since the first long side area L1 is suction-held through the suction holes VH (refer to FIG. 5B), the first long side area L1 may be uniformly suction-held to the lower surface of the suction-holding unit ADP. The unit mask MST may be spaced apart from an upper surface of the open mask OM. The second chuck CH2 may also suction-hold the second long side area L2.

The tensioner TSM may be in contact with the first long side area L1 and the second long side area L2 and may apply a tensile force to the unit mask MST along a direction to allow the first long side area L1 and the second long side area L2 to be away from each other. For example, the first chuck CH1 may apply the force in the direction opposite to the second direction DR2 while lifting the first long side area L1, and the second chuck CH2 may apply the force in the second direction DR2 while lifting the second long side area L2. Accordingly, the force may be applied to the unit mask MST in the direction parallel to the second direction DR2, and the unit mask MST may be tensioned in the direction parallel to the second direction DR2. Accordingly, the unit mask MST may be prevented from sagging in the cell area CA.

Referring to FIGS. 5C and 5E, in case that the unit mask MST is aligned in position, the first chuck CH1 and the second chuck CH2 may descend. In FIG. 5E, the first chuck CH1 may move in a direction opposite to the third direction DR3. Accordingly, the holding area HA (refer to FIG. 4) of the unit mask MST may be in contact with the upper surface of the open mask OM. In detail, the first long side area L1 of the unit mask MST may be in contact with an upper surface of the intermediate portion MP of the open mask OM, and the second long side area L2 of the unit mask MST may be in contact with an upper surface of the edge portion EP of the open mask OM. Accordingly, the cell area CA of the unit mask MST may overlap the first opening OP1 of the open mask OM.

Figure 6A:
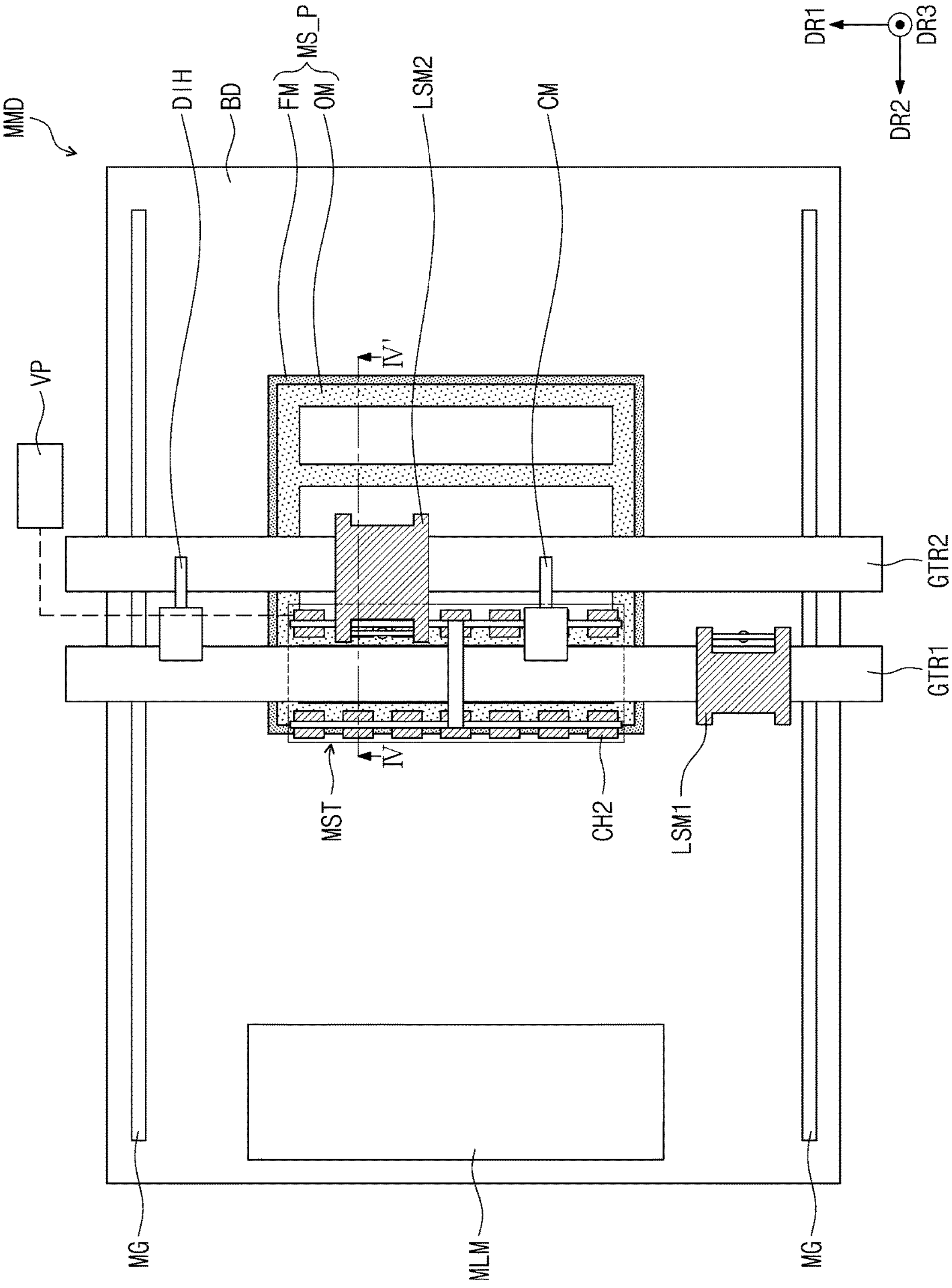
FIG. 6A is a schematic plan view to explain a process of the method of manufacturing the mask assembly according to an embodiment.
Figure 6B:
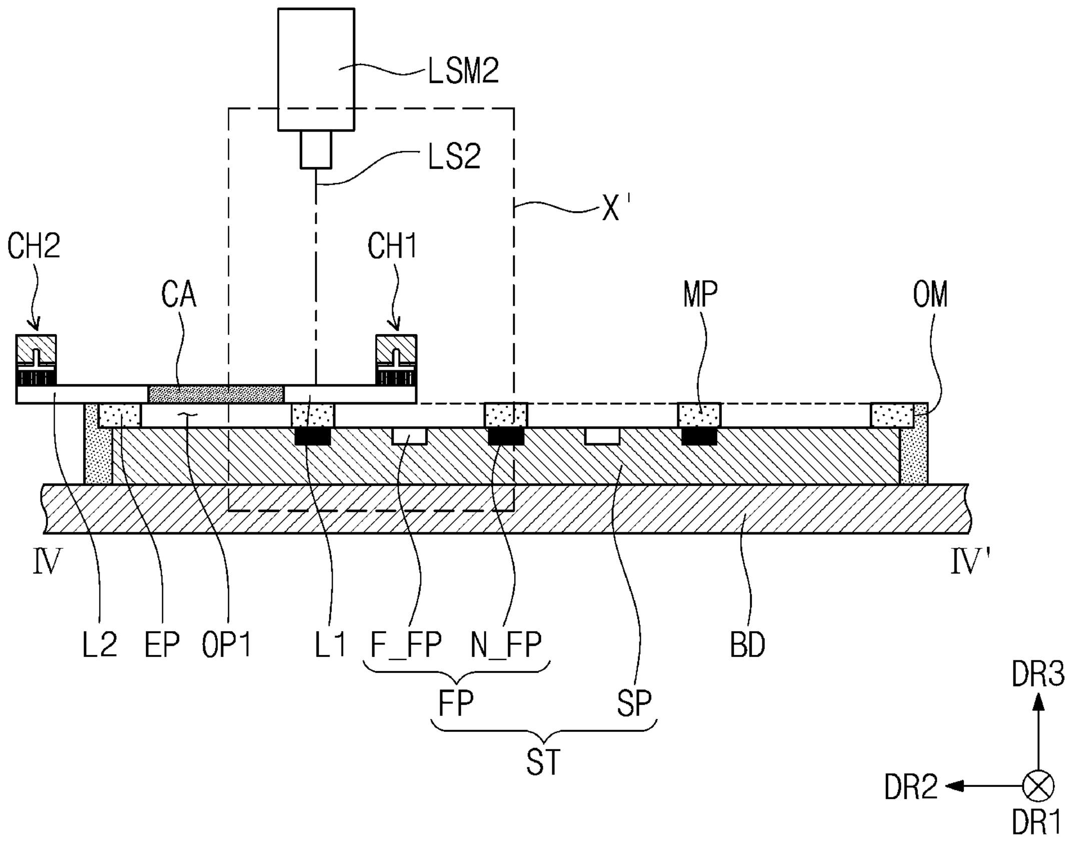
FIG. 6B is a schematic cross-sectional view taken along line IV-IV' of FIG. 6A.
Figure 6C:
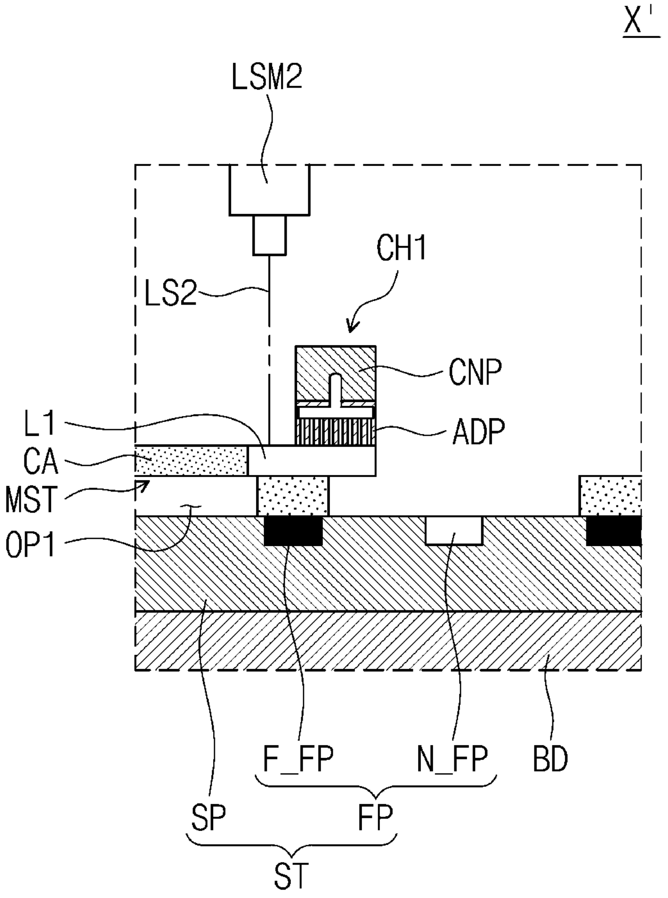
FIG. 6C is an enlarged view of a portion corresponding to an area X' of FIG. 6B.
Figure 6D:
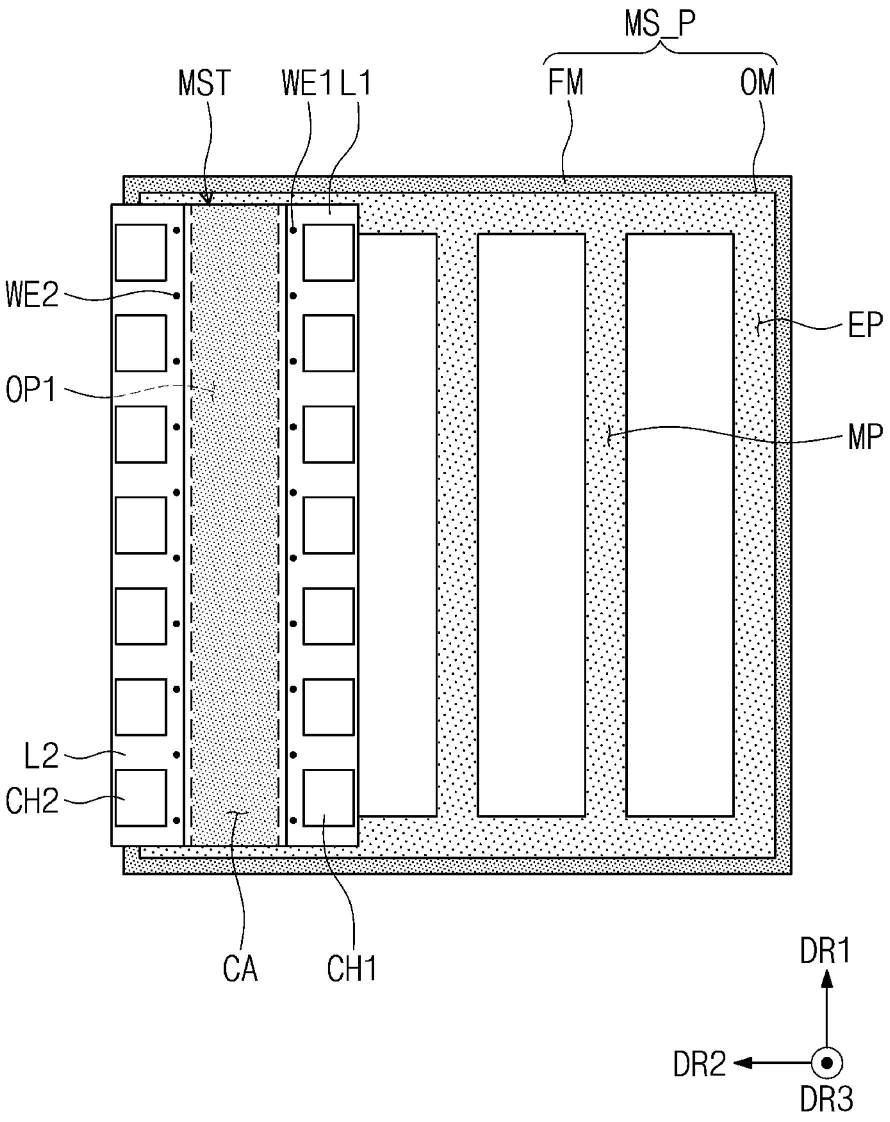
FIG. 6D is a schematic plan view of a first chuck, a second chuck, a preliminary mask assembly, and a unit mask used in the manufacturing method of the mask assembly according to an embodiment.

FIG. 6A is a schematic plan view to explain a process of the method of manufacturing the mask assembly according to an embodiment. FIG. 6B is a schematic cross-sectional view taken along line IV-IV' of FIG. 6A. FIG. 6C is an enlarged view of a portion corresponding to an area X' of FIG. 6B. FIG. 6D is a schematic plan view of the first chuck CH1, the second chuck CH2, the preliminary mask assembly MS_P, and the unit mask MST used in the manufacturing method of the mask assembly according to an embodiment.

Referring to FIGS. 2, 6A, 6B, and 6C, the unit mask MST may be welded to the open mask OM using the second laser unit LSM2 (S300). The second gantry GTR2 may move in the direction parallel to the second direction DR2, and the second laser unit LSM2 may move in the direction parallel to the first direction DR1 above the second gantry GTR2. For example, the second laser unit LSM2 may move to a position where the unit mask MST is welded.

Referring to FIGS. 6B, 6C, and 6D, the second laser unit LSM2 may irradiate the second laser beam LS2. The second laser beam LS2 may have a wavelength band in the range of milliseconds (ms) to nanoseconds (ns). The second laser unit LSM2 may weld the first long side area L1 and the second long side area L2 to the intermediate portion MP or the edge portion EP of the open mask OM.

In detail, the second laser unit LSM2 may irradiate the second laser beam LS2 to an area overlapping the intermediate portion MP of the open mask OM between the first long side area L1, which is in contact with the first chuck CH1 of the tensioner TSM (refer to FIG. 6A), and the first opening OP1 of the open mask OM in a plan view to form a first welding point WE1. Accordingly, the first long side area L1 may be welded and fixed to the intermediate portion MP of the open mask OM. The first welding point WE1 may be provided in plural along the direction parallel to the first direction DR1. After the first long side area L1 is welded by the second laser unit LSM2, the second gantry GTR2 (refer to FIG. 6A) may move in the second direction DR2.

Although not shown in figures, the second laser unit LSM2 may weld the second long side area L2. The second laser unit LSM2 may irradiate the second laser beam LS2 to an area overlapping the edge portion EP of the open mask OM between the second long side area L2, which is in contact with the second chuck CH2 of the tensioner TSM, and the first opening OP1 of the open mask OM in a plan view to form a second welding point WE2. Accordingly, the second long side area L2 may be welded and fixed to the edge portion EP of the open mask OM. The second welding point WE2 may be provided in plural along the direction parallel to the first direction DR1.

The first welding point WE1 and the second welding point WE2 may be referred to as the plural welding points WE1 and WE2. The plural welding points WE1 and WE2 may not overlap an edge of a short side of the unit mask MST, which extends in the second direction DR2.

Figure 7A:
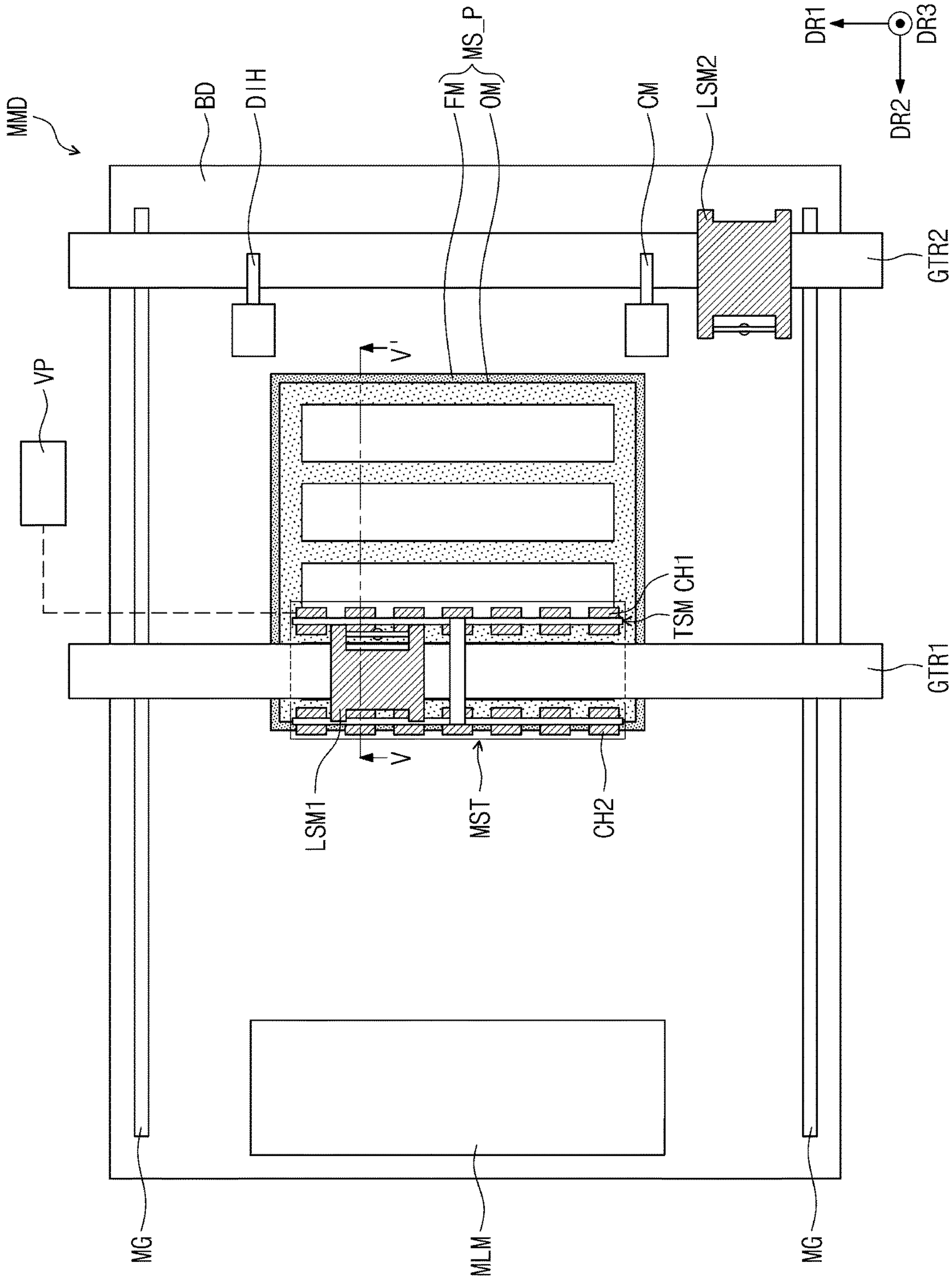
FIG. 7A is a schematic plan view to explain a process of the method of manufacturing the mask assembly according to an embodiment.
Figure 7B:
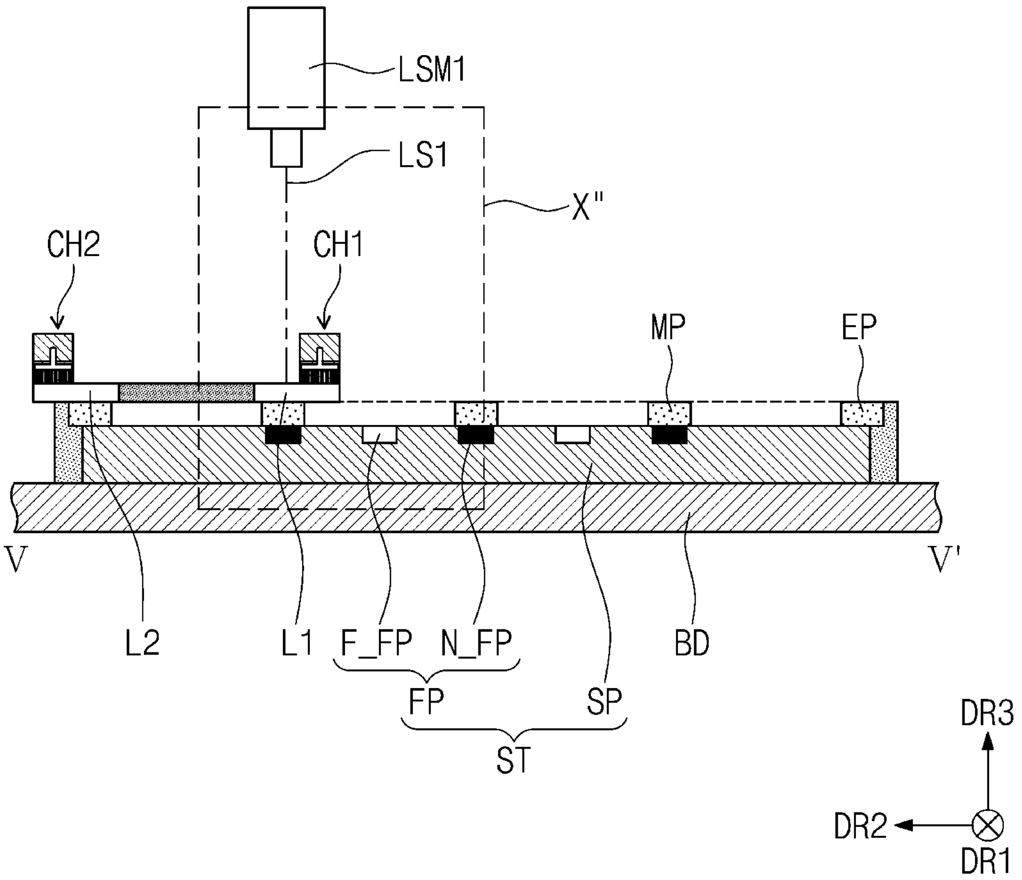
FIG. 7B is a schematic cross-sectional view taken along line V-V' of FIG. 7A.
Figure 7C:
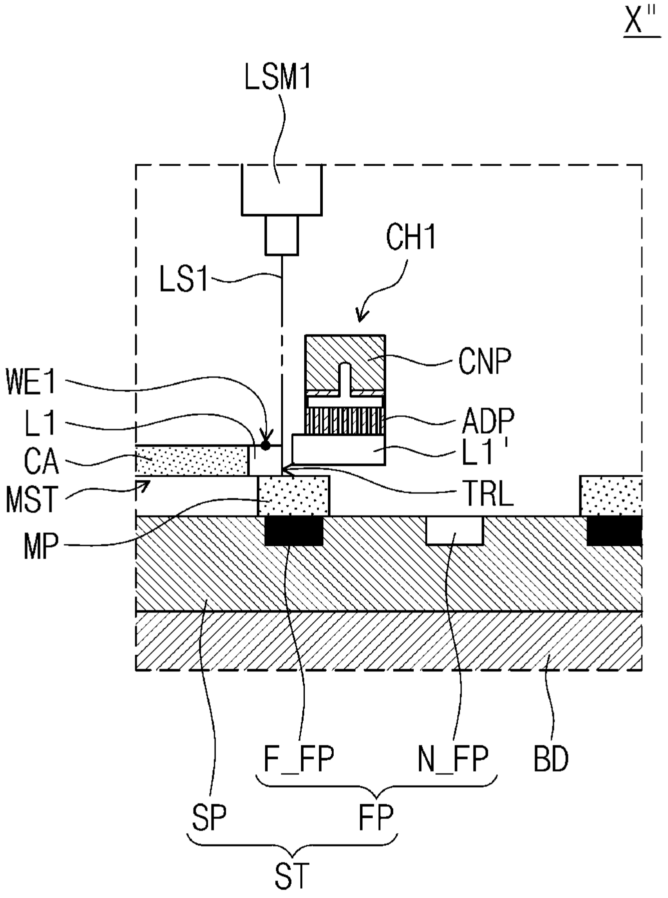
FIG. 7C is an enlarged view of a portion corresponding to an area X" of FIG. 7B.
Figure 7D:
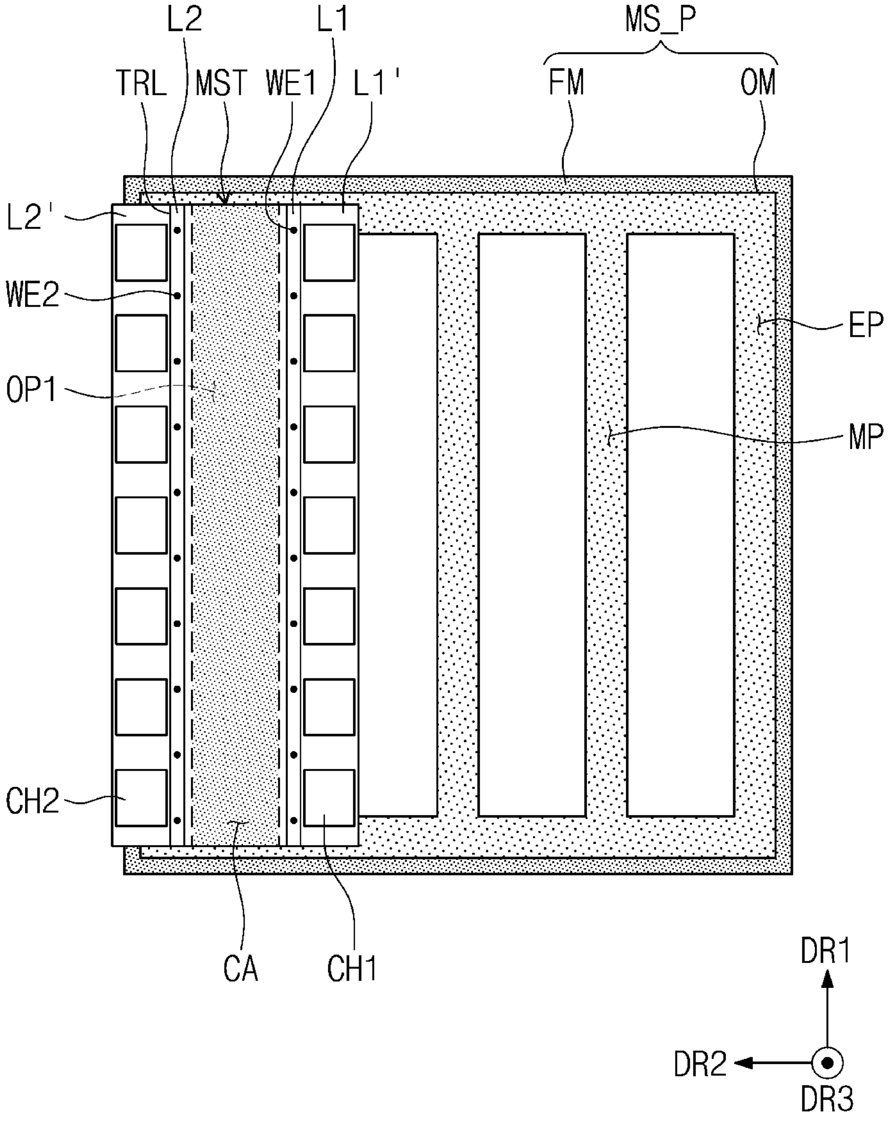
FIGS. 7D and 7E are schematic plan views of a first chuck, a second chuck, a preliminary mask assembly, and a unit mask used in the manufacturing method of the mask assembly according to an embodiment.
Figure 7E:
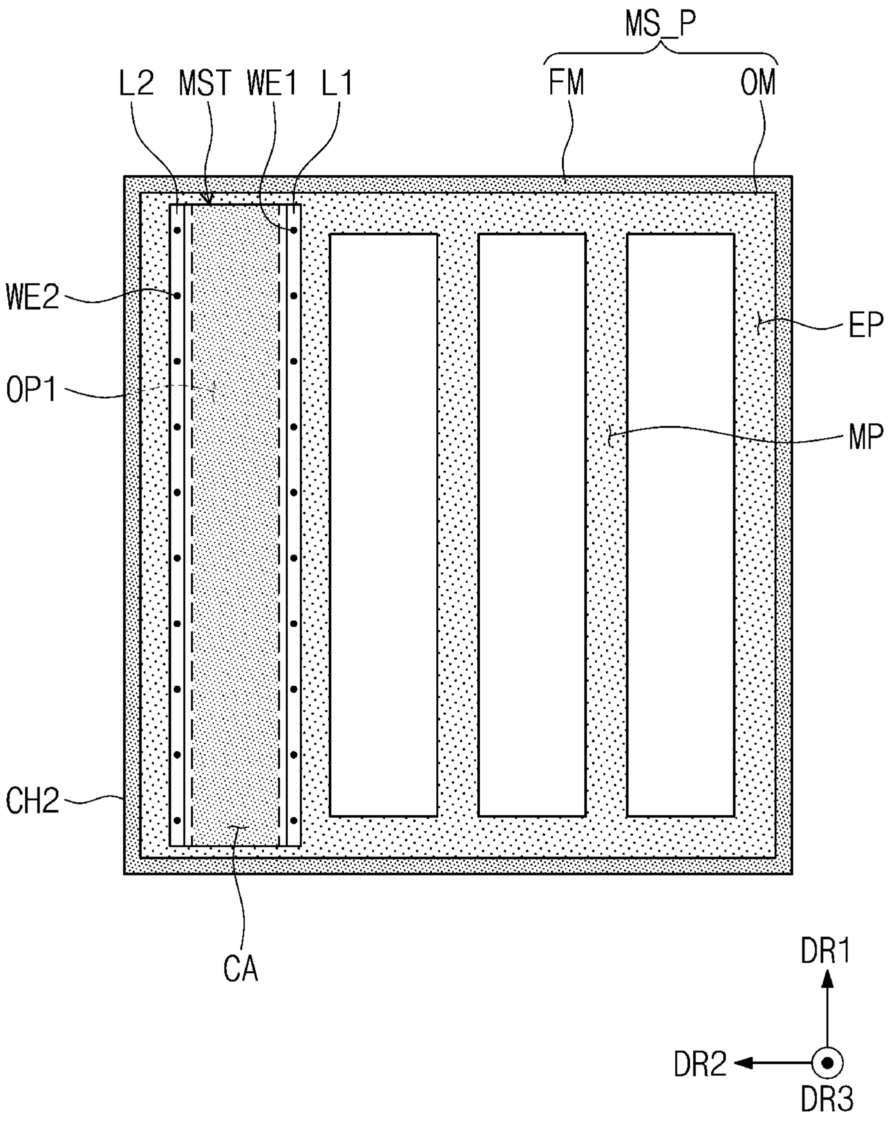

FIG. 7A is a schematic plan view to explain a process of the method of manufacturing the mask assembly according to an embodiment. FIG. 7B is a schematic cross-sectional view taken along line V-V' of FIG. 7A. FIG. 7C is an enlarged view of a portion corresponding to an area X" of FIG. 7B. FIGS. 7D and 7E are schematic plan views of the first chuck CH1, the second chuck CH2, the preliminary mask assembly MS_P, and the unit mask MST used in the manufacturing method of the mask assembly according to an embodiment.

Referring to FIGS. 2, 7A, and 7C, the portion of the unit mask MST may be cut using the first laser unit LSM1 (S400). The first gantry GTR1 may move in the direction parallel to the second direction DR2, and the first laser unit LSM1 may move in the direction parallel to the first direction DR1 above the first gantry GTR1. For example, the first laser unit LSM1 may move to a position where the unit mask MST is cut.

Referring to FIGS. 7B and 7C, the first laser unit LSM1 may irradiate the first laser beam LS1. The first laser beam LS1 may have a wavelength band in the range of picoseconds (ps) to femtoseconds (fs) to smoothly cut the unit mask MST. The first laser unit LSM1 may cut portions L1' and L2' (refer to FIG. 7D) of the first long side area L1 and the second long side area L2.

In detail, the first laser unit LSM1 may irradiate the first laser beam LS1 to an area between the first long side area L1, which is in contact with the first chuck CH1 of the tensioner TSM (refer to FIG. 7A), and the first welding point WE1. For example, a trimming line TRL may be disposed on the first long side area L1 and may be placed closer to the first chuck CH1 than the first welding point WE1 is. Accordingly, the portion L1' of the first long side area L1 may be cut and separated from the first long side area L1. A portion of the first long side area L1, which protrudes outside the intermediate portion MP of the open mask OM, may be removed. A method of cutting the portion L2' of the second long side area L2 may be substantially the same as the method of cutting the portion L' of the first long side area L1.

Referring to FIG. 7D, the first laser unit LSM1 (refer to FIG. 7A) may irradiate the first laser beam LS1 (refer to FIG. 7C) to the area between the second long side area L2, which is in contact with the second chuck CH2 of the tensioner TSM (refer to FIG. 7A), and the second welding point WE2. For example, the trimming line TRL may be disposed on the second long side area L2 and may be placed closer to the second chuck CH2 than the second welding point WE2 is. Accordingly, the portion L2' of the second long side area L2 may be cut and separated from the second long side area L2. A portion of the second long side area L2, which protrudes outside the edge portion EP of the open mask OM, may be removed.

Referring to FIG. 7E, the unit mask MST may be cut along the trimming line TRL (refer to FIG. 7D). An edge of the first long side area L1 of the cut unit mask MST may overlap the intermediate portion MP of the open mask OM, and an edge of the second long side area L2 of the cut unit mask MST may overlap the edge portion EP of the open mask OM.

Figure 8:
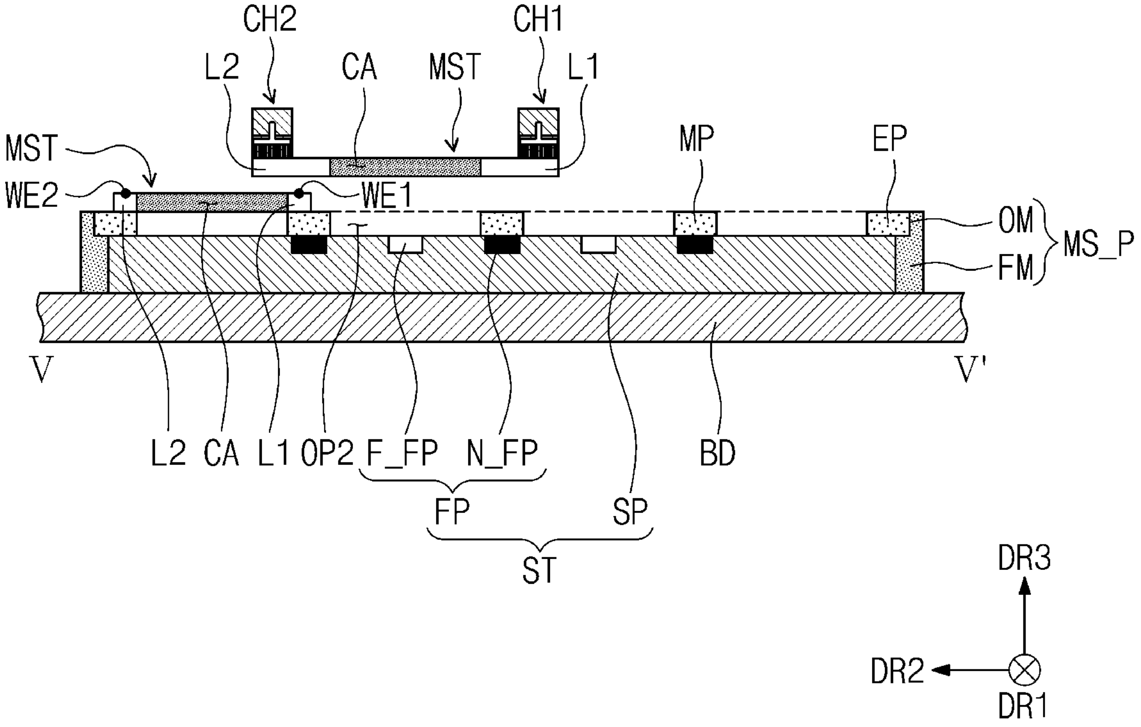
FIG. 8 is a schematic cross-sectional view to explain a process of the method of manufacturing the mask assembly according to an embodiment.

FIG. 8 is a schematic cross-sectional view to explain a process of the method of manufacturing the mask assembly according to an embodiment. FIG. 8 shows a process of cutting the portion of the unit mask MST that is first welded and a process of coupling a second unit mask MST with the preliminary mask assembly MS_P.

Referring to FIGS. 2 and 8, the second unit mask MST may be disposed above the open mask OM (S200). The cell area CA of the second unit mask MST may overlap the second opening OP2, and the first long side area L1 and the second long side area L2 of the second unit mask MST may overlap the intermediate portion MP of the open mask OM adjacent to the second opening OP2.

Although the subsequent process is not shown, the process of welding the second unit mask MST may be substantially the same as the process of welding the first unit mask MST. The second unit mask MST may be welded to the open mask OM using the second laser unit LSM2 (refer to FIG. 6A). Different from the first unit mask MST, the first long side area L1 and the second long side area L2 of the second unit mask MST may be welded to the intermediate portion MP of the open mask OM. Portions of the first long side area L1 and the second long side area L2 of the second unit mask MST may be cut using the first laser unit LSM1 (refer to FIG. 7A). As a result, the second unit mask MST may not overlap the first unit mask MST.

After the second unit mask MST is coupled with the preliminary mask assembly MS_P, the process of coupling the unit masks (not shown) with the preliminary mask assembly MS_P may be repeated.

Figure 9:
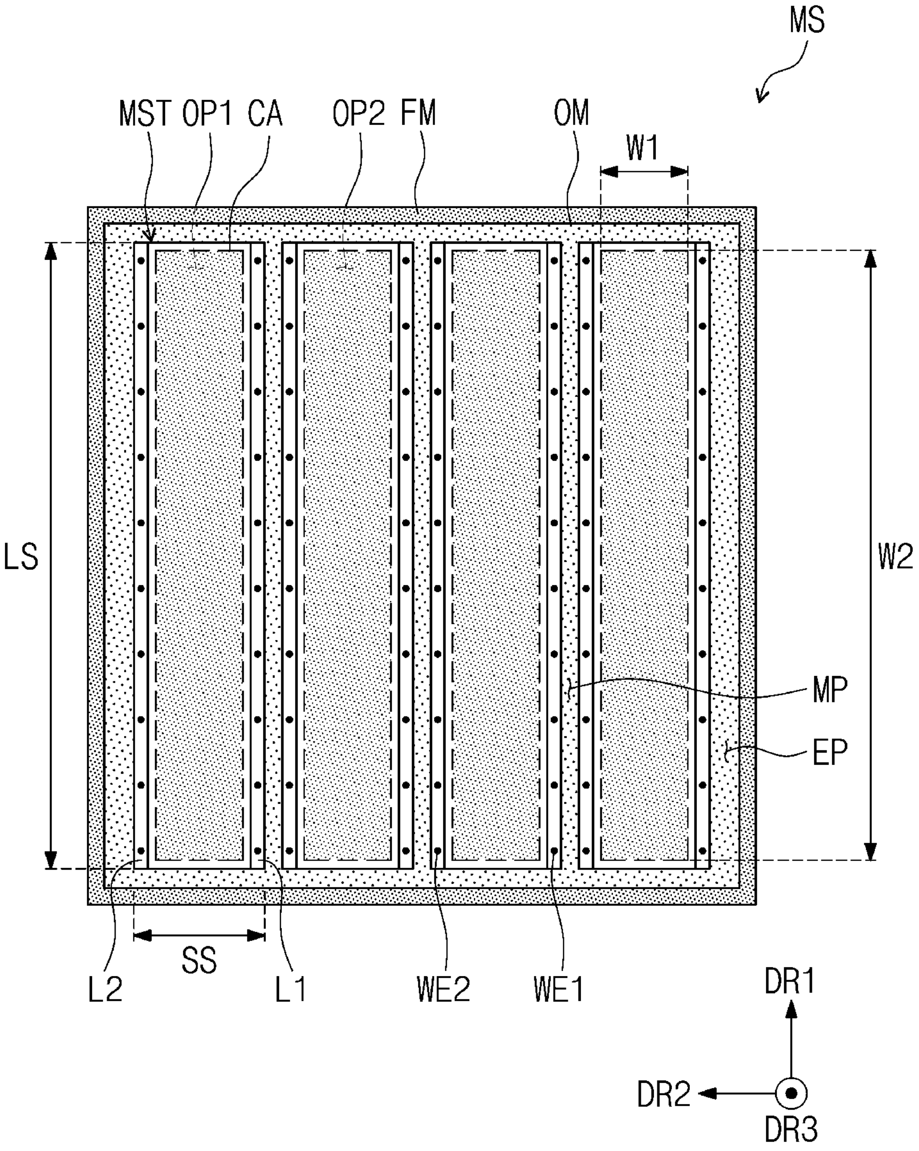
FIGS. 9 and 10 are views of mask assemblies according to embodiments.
Figure 10:
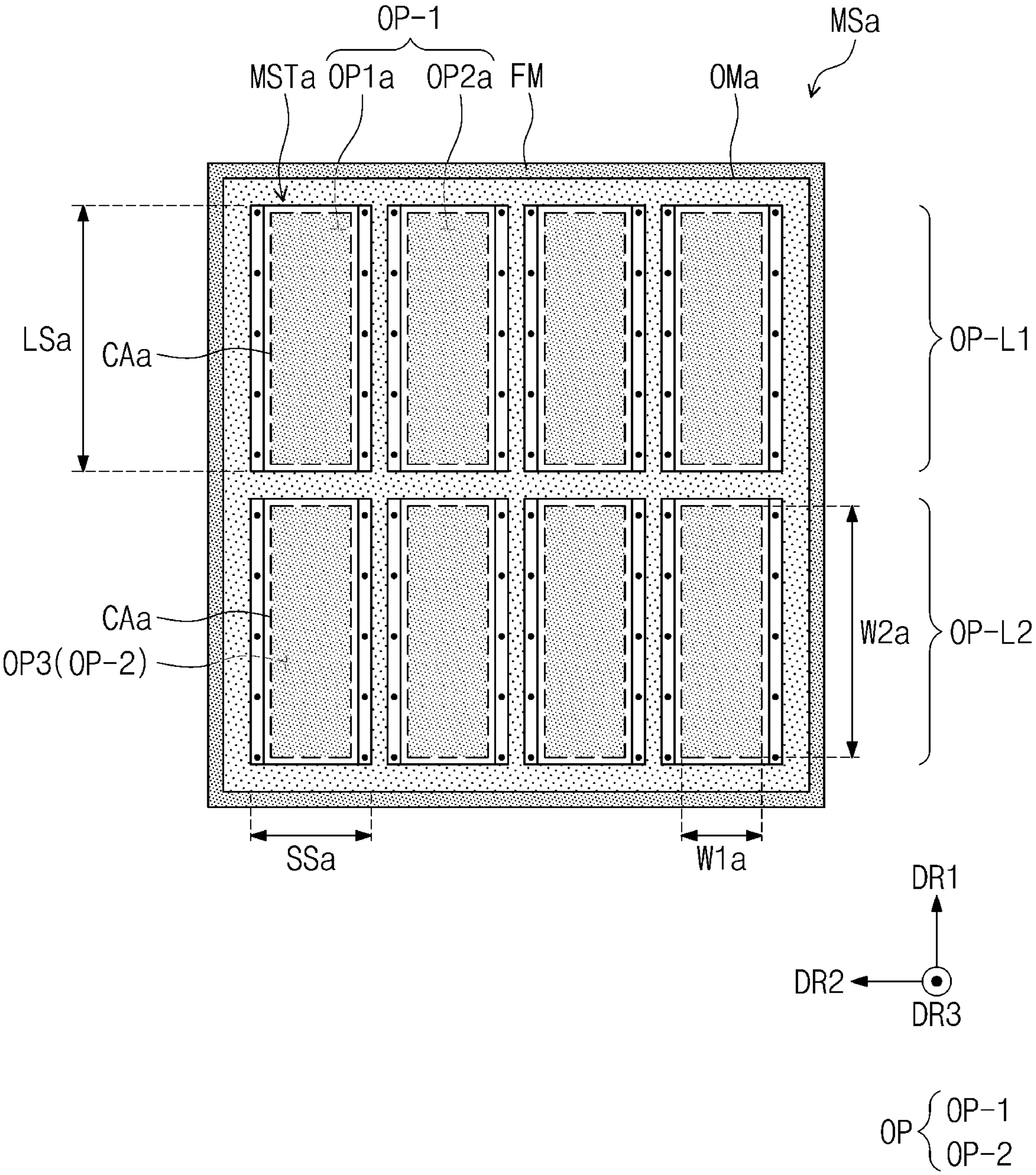

FIGS. 9 and 10 are views of mask assemblies MS and MSa according to embodiments. In FIG. 10, the same reference numerals denote the same elements in FIG. 9, and thus, detailed descriptions of the same elements may be omitted.

Referring to FIGS. 2 and 9, the placing of the unit mask MST on the open mask OM (S200), the welding of the unit mask MST to the open mask OM (S300), and the cutting of the portion of the unit mask MST (S400) may be repeatedly performed, and thus, the plural unit masks MST may be coupled with and fixed to the preliminary mask assembly MS_P (refer to FIG. 3A). The mask assembly MS may be manufactured by repeating the above processes.

Referring to FIG. 9, the mask assembly MS may include the frame FM, the open mask OM, and the unit masks MST. The unit masks MST may include long sides LS extending in the first direction DR1 and short sides SS extending in the second direction DR2 intersecting the first direction DR1. The long sides LS may have a width longer than a width of the short sides SS. The frame FM and the open mask OM may support the unit masks MST.

The welding points WE1 and WE2 may be arranged in the first long side areas L1 and the second long side areas L2 of the unit mask MST to couple the open mask OM with the unit mask MST. The first and second long side areas L1 and L2 of the unit masks MST may be welded to the edge portion EP or the intermediate portion MP of the open mask OM. The welding points WE1 and WE2 may not overlap the edge of the short side of the unit mask MST, which extend in the second direction DR2.

FIG. 9 shows the unit mask MST having a quadrangular shape as a representative example, however, the shape of the unit mask MST should not be limited thereto or thereby and may vary depending on a shape of product and a deposition shape. As an example, the unit mask MST may have a variety of shapes such as a polygonal shape, a circular shape, an oval shape, or an irregular shape.

Each of the unit masks MST may include the cell area CA defined therein. The cell area CA may extend in the direction in which the unit mask MST extends, for example, the second direction DR2. In detail, the cell area CA may have the first width W1 parallel to the second direction DR2 and the second width W2 parallel to the first direction DR1 and greater than the first width W1. In case that the unit mask MST is tensioned in the second direction DR2, the cell area CA defined in the unit mask MST may be tensioned in the second direction DR2. For example, the tensile direction (for example, a direction of the short side SS) of the unit mask MST may be perpendicular to the direction of the second width W2 of the cell area CA.

Where the tensile force for the unit mask MST is insufficient, a bending portion may occur in the unit mask MST, and the bending portion in the unit mask MST may cause a deposition stain. Accordingly, the tensile force equal to or greater than a certain or given intensity may be required to prevent the bending of the unit mask MST. However, a four-sides tension corresponding to the tension in the first direction DR1 and the second direction DR2 may require up to ten times the tensile force compared with a two-sides tension corresponding to the tension in the first direction DR1 or the second direction DR2 in case that a tensile rate is uniform. As a result, a reaction force may occur in the mask assembly MS manufactured by the four-sides tension, the pixel position accuracy (PPA) may be changed up to about 10 micrometers outside the cell area CA, and thus, the deposition stain may occur.

In the process of coupling the unit mask MST with the open mask OM, the mask assembly MS may be manufactured by coupling the unit mask MST with the open mask OM using the two-sides tension in the first direction DR1 or the second direction DR2 rather than the four-sides tension in the first direction DR1 and the second direction DR2. In case that compared with the four-sides tension, the tensile force required in the two-sides tension of the unit mask MST may be reduced by about ten times with respect to the same tensile rate, and thus, the reaction force may be reduced. An alignment error outside the cell area CA of the unit mask MST, for example, the pixel position accuracy (PPA), may be up to about 0.3 micrometers in the tensile direction, and thus, the alignment error may be reduced compared with the four-sides tension. Accordingly, in case that the mask assembly MS manufactured according to the disclosure is used, the reliability in deposition may be improved.

Where a fine metal mask stick (hereinafter, referred to as a FMM stick) through which opening patterns for deposition are defined is used as the unit mask MST, the FMM stick may be tensioned using a clamp. Since the clamp is not able to enter the frame, the tensile direction of the FMM stick may be fixed to a certain or given direction. Accordingly, it may be impossible to deposit using the FMM stick depending on a proportion, shape, or size of the product. However, according to the disclosure, the mask assembly manufacturing apparatus MMD (refer to FIG. 1) may suction-hold the upper surface of the unit mask MST and may tension the unit mask MST provided in the cell unit using the tensioner TSM (refer to FIG. 1). As an example, since the tensioner TSM is able to enter the frame FM or the open mask OM, the size of the unit mask MST and the tensile direction of the unit mask MST should not be particularly limited. For example, a process freedom may be improved in case that the mask assembly MS in which the unit mask MST is welded onto the open mask OM is manufactured. Accordingly, the mask assembly manufacturing apparatus MMD may be applied to the process of manufacturing the mask assembly MS that is used to form products with various design features.

Referring to FIG. 10, the mask assembly MSa may include a frame FM, an open mask OMa, and unit masks MSTa. The open mask OMa may include openings OP-1 defining a first row OP-L1 and openings OP-2 defining a second row OP-L2. The openings OP-1 of the first row OP-L1 may be spaced apart from each other in the direction parallel to the second direction DR2, and the openings OP-2 of the second row OP-L2 may be spaced apart from each other in the direction parallel to the second direction DR2. The first row OP-L1 may be spaced apart from the second row OP-L2 in the first direction DR1. Hereinafter, a first opening OP1*a* and a second opening OP2*a* among the openings OP-1 defining the first row OP-L1 and a third opening OP3 among the openings OP-2 defining the second row OP-L2 will be described in detail.

The unit masks MSTa may cover the first opening OP1*a*, the second opening OP2*a*, and the third opening OP3 and may be coupled with the open mask OMa. The unit masks MSTa may include long sides LSa extending in the first direction DR1 and short sides SSa extending in the second direction DR2 intersecting the first direction DR1. The long sides LSa may have a width longer than a width of the short sides SSa. The frame FM and the open mask OMa may support the unit masks MSTa. The unit masks MSTa may be arranged in the first direction DR1 and the second direction DR2 and may be spaced apart from each other. FIG. 10 shows eight unit masks MSTa arranged in two rows by four columns as a representative example, however, the number and the arrangement of the unit masks MSTa should not be limited thereto or thereby.

Each of the unit masks MSTa may include one cell area CAa defined therein. The cell area CAa may extend in the direction in which the unit masks MSTa extend, for example, the second direction DR2. In detail, the cell area CAa may have a first width W1*a* in the second direction DR2 and a second width W2*a* in the first direction DR1, and the second width W2*a* may be greater than the first width W1*a*. In case that the unit mask MSTa is tensioned in the second direction DR2, the cell area CAa defined in the unit mask MSTa may be also tensioned in the second direction DR2. For example, the direction (a direction of the short side, SSa) in which the unit mask MSTa is tensioned may be perpendicular to the second direction DR2 parallel to the second width W2*a* of the cell area CAa.

According to an embodiment, the unit mask MSTa may be tensioned using the tensioner TSM (refer to FIG. 1). In detail, each of the unit masks MSTa may be tensioned to correspond to openings OP of the open mask OMa in the cell unit and may be coupled with the open mask OMa.

According to the disclosure, the mask assembly manufacturing apparatus MMD (refer to FIG. 1) may suction-hold an upper surface of the unit mask MSTa using the tensioner TSM (refer to FIG. 1) and may tension the unit mask MSTa in the cell unit. As an example, since the tensioner TSM is able to enter the frame FM or the open mask OMa, the size of the unit mask MSTa and the tensile direction of the unit mask MSTa should not be particularly limited.

Accordingly, the unit mask MSTa may be arranged on the open mask OMa in various directions rather than a fixed direction. The number of cells that are chamfered in one deposition line may increase by adjusting the arrangement of the openings OP1*a*, OP2*a*, and OP3 of the open mask OMa. As an example, in case that the FMM stick is used, the stick may be arranged in only one row by multiple columns on the frame FM, however, in case that the unit mask MSTa is used, the unit masks MSTa may be arranged in multiple rows by multiple columns on the open mask OMa.

The open mask OMa may include the openings OP1*a*, OP2*a*, and OP3 arranged in multiple rows or multiple columns regardless of the direction in which the unit mask MSTa is tensioned. As an example, the mask assembly MSa for manufacturing display devices meets the needs for the integration of an automobile instrument panel and a navigation unit with a ratio of 10 to 1. The manufacturing cost may be reduced and the efficiency of the production equipment may increase by increasing the number of chamfered cells in one deposition line.

FIGS. 9 and 10 show the mask assembly MSa to manufacture a display panel with a quadrangular shape as a representative example, however, a mask assembly MS required to form a product with an irregular-shaped deposition area rather than the quadrangular shape may be formed.

Figure 11:
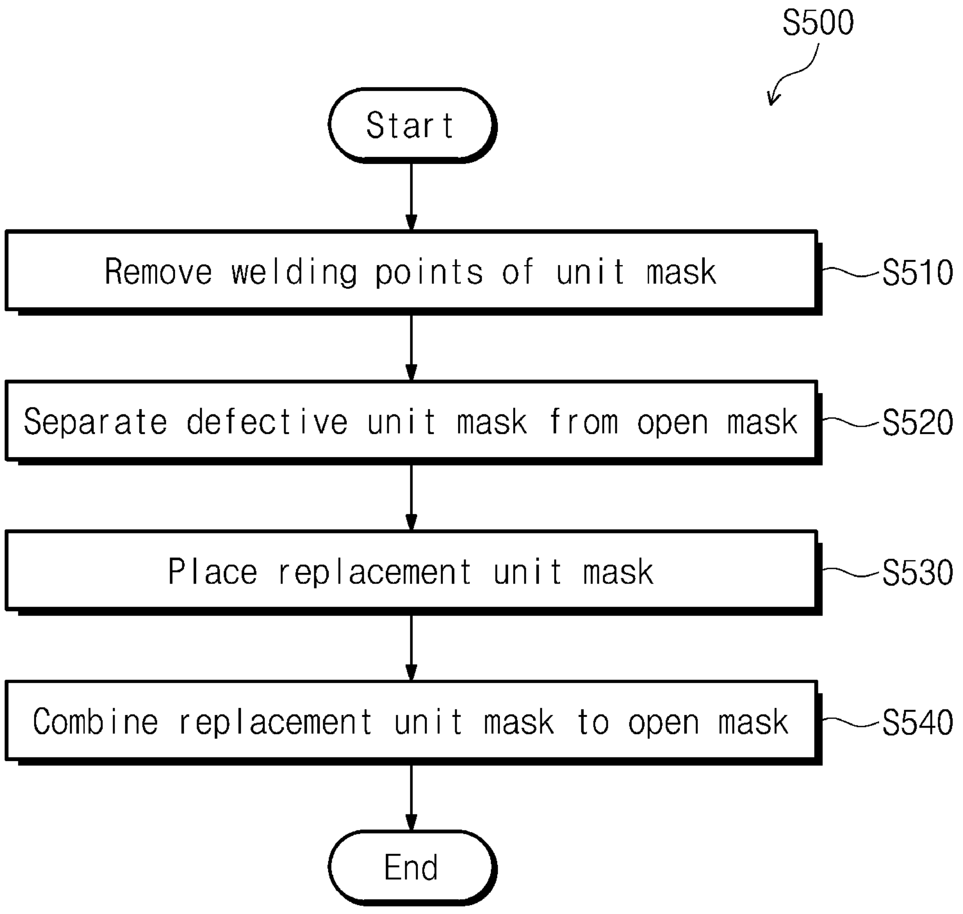
FIG. 11 is a flowchart of a method of repairing the mask assembly according to an embodiment.

FIG. 11 is a flowchart of a method of repairing the mask assembly according to an embodiment. FIGS. 12A to 12E are views to explain the method of repairing the mask assembly according to an embodiment.

Referring to FIGS. 9, 11, 12A, and 12B, the mask assembly MS may be repaired in case that the unit mask MST is defected (S500). The following descriptions will be made on the assumption that a defect occurs in the first unit mask MST among the four unit masks MST of FIG. 9.

Figure 12A:
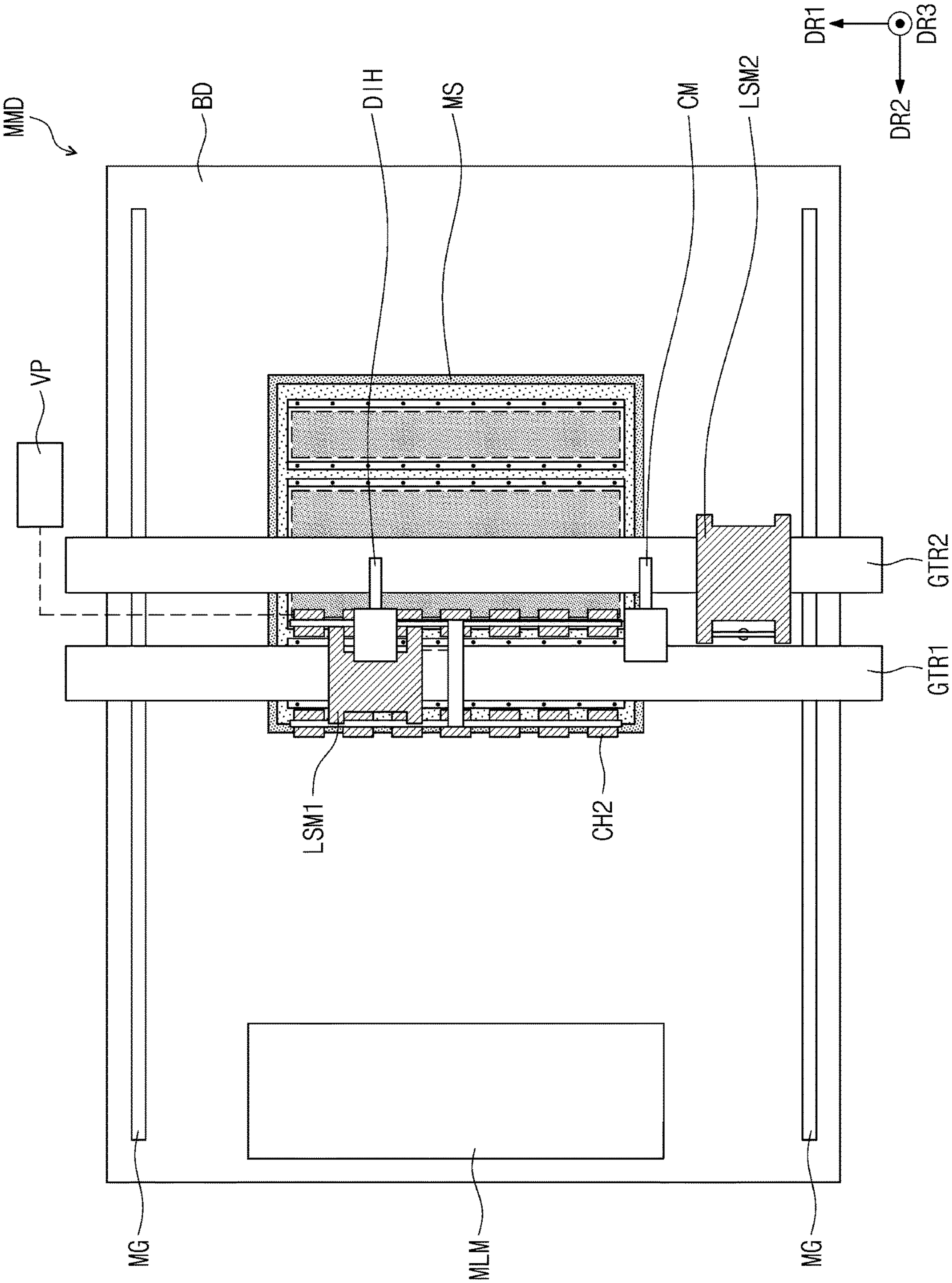
FIGS. 12A to 12E are views to explain the method of repairing the mask assembly according to an embodiment.
Figure 12B:
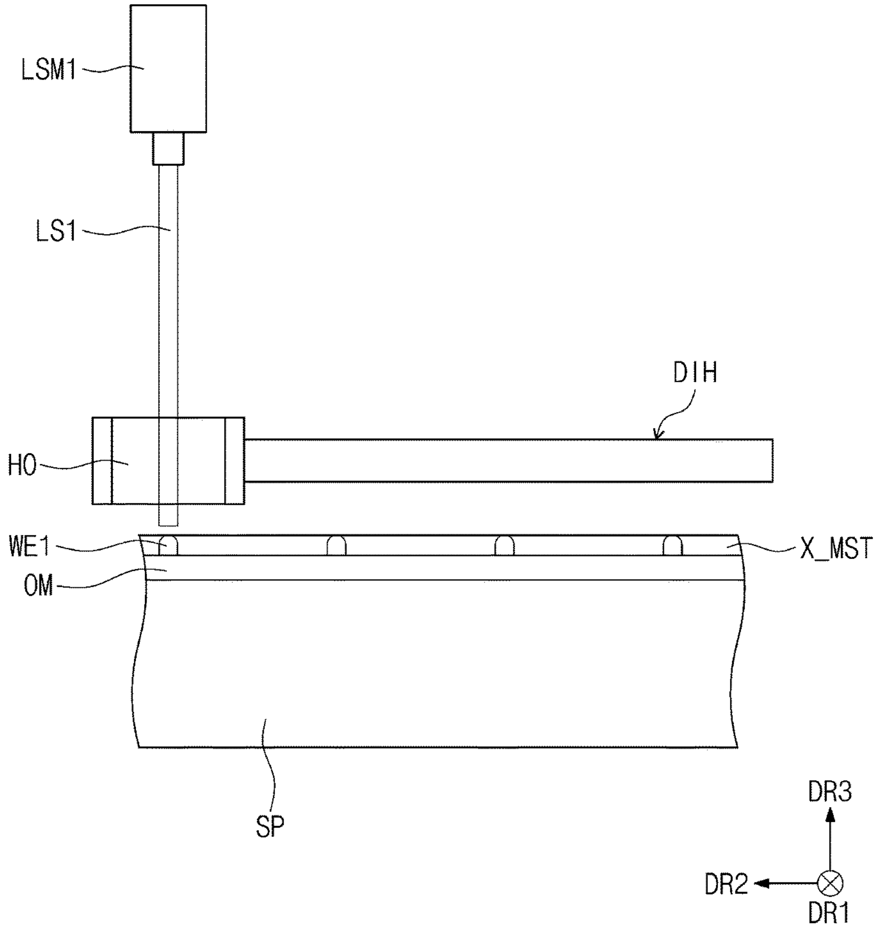

First, the first laser unit LSM1 may irradiate the first laser beam LS1 to remove the welding points WE1 of a unit mask X_MST in which the defect occurs (S510). The first laser unit LSM1 may be the first laser unit LSM1 of the mask assembly manufacturing apparatus MMD shown in FIG. 1. In FIG. 12B, the first laser beam LS1 is irradiated to the first welding points WE1, however, it should not be limited thereto or thereby. As an example, the first gantry GTR1 may move in the direction parallel to the second direction DR2, and the first laser unit LSM1 may move in the direction parallel to the first direction DR1 above the first gantry GTR1. Accordingly, the first laser unit LSM1 may remove the first welding points WE1 formed on the intermediate portion MP of the open mask OM, and may move to the edge portion EP of the open mask OM to remove the second welding points WE2 (refer to FIG. 9) formed on the edge portion EP.

A dust may be generated during the process of removing the welding points WE1 by irradiating the first laser beam LS1. The dust suction unit DIH may suction the dust and may remove the dust. In detail, the first laser unit LSM1 may irradiate the first laser beam LS1 to multiple welding points WE1 to allow the first laser beam LS1 to pass a hole HO of the dust suction unit DIH. The dust suction unit DIH may suction the dust generated during the irradiation of the first laser beam LS1 and may remove the dust.

The defective unit mask X_MST may be separated from the open mask OM (S520). However, the order and the method of separating the defective unit mask X_MST from the open mask OM should not be limited thereto or thereby. As an example, after physically removing the unit mask X_MST, residues of the welding points WE1 may be removed using the first laser unit LSM1. The residues of the welding points WE1 may be all or a part of the welding points WE1 left in the process of removing the defective unit mask X_MST. In case that the defective unit mask X_MST is separated, a portion of the welding points WE1 may be removed together with the defective unit mask X_MST. The welding points WE1 may remain on the open mask OM, and only the defective unit mask X_MST may be removed.

Figure 12C:
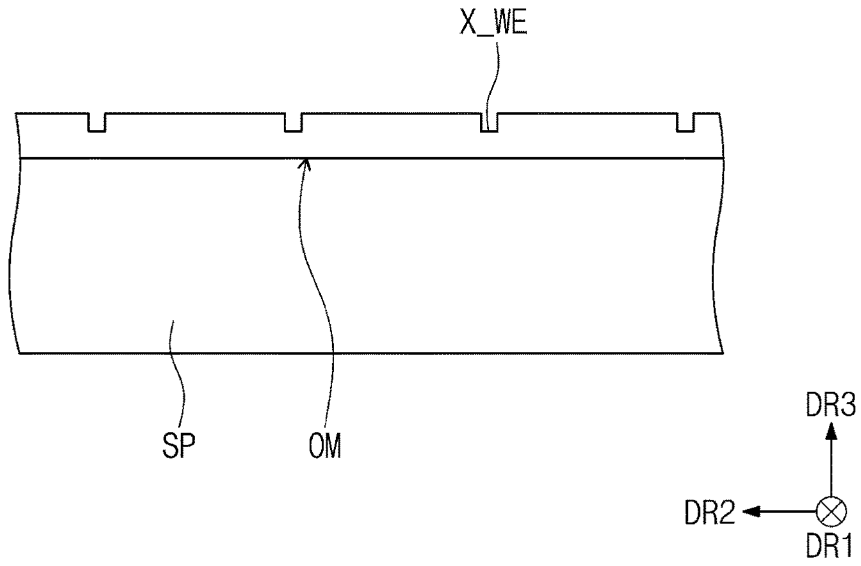

Referring to FIG. 12C, the welding points WE1 (refer to FIG. 12B) present in the open mask OM may be removed, and a welding point removing pattern X_WE with a concave shape may be formed on the upper surface of the open mask OM.

Figure 12D:
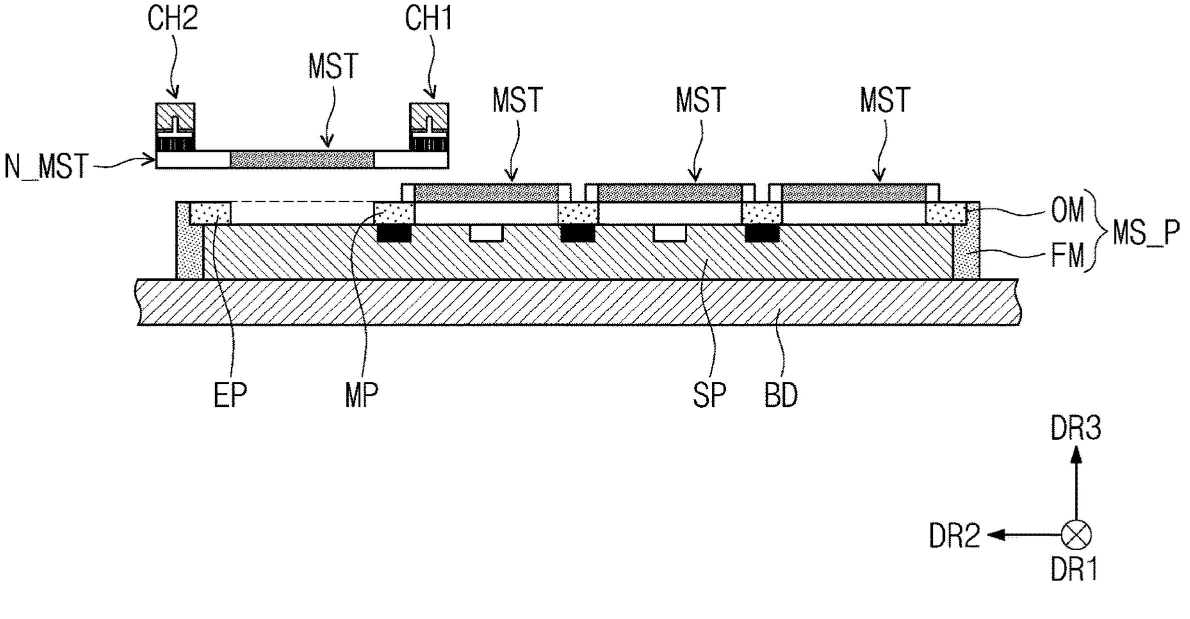

Referring to FIG. 12D, a replacement unit mask N_MST may be disposed on the open mask OM (S530). In detail, the replacement unit mask N_MST may be disposed in one of the openings OP1 and OP2 of the open mask OM. The replacement unit mask N_MST may be coupled with the open mask OM through the processes shown in FIGS. 5A to 7E (S540).

Figure 12E:
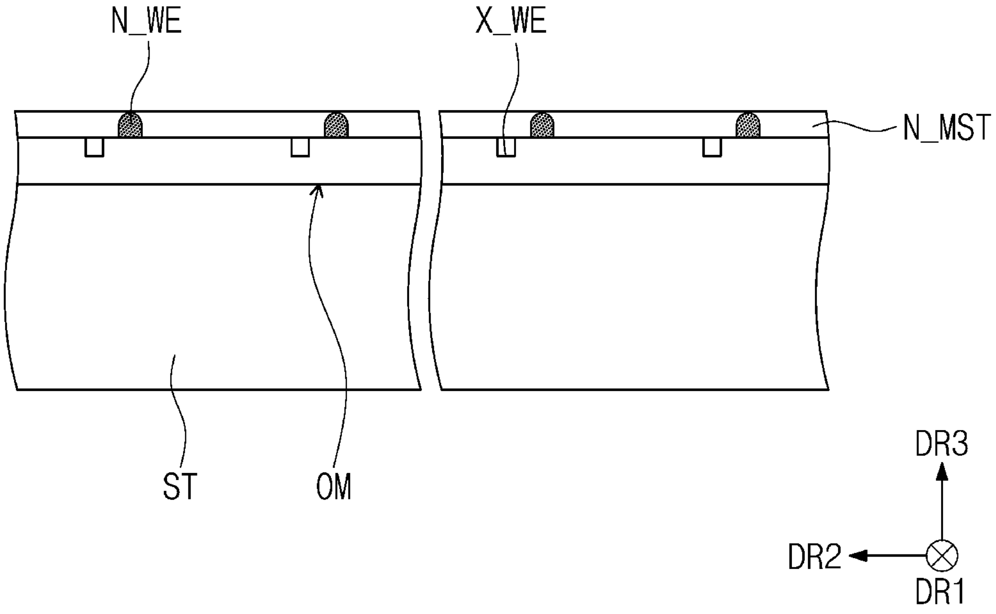

Referring to FIG. 12E, the replacement unit mask N_MST may be coupled with the open mask OM by a new welding point N_WE. The welding point removing pattern X_WE and the new welding point N_WE may be spaced apart from each other.

According to the disclosure, the mask assembly manufacturing apparatus MMD (refer to FIG. 1) may be used to repair the unit mask MST, and thus, may replace a separate facility for the repair of the mask assembly MS.

Figure 13:
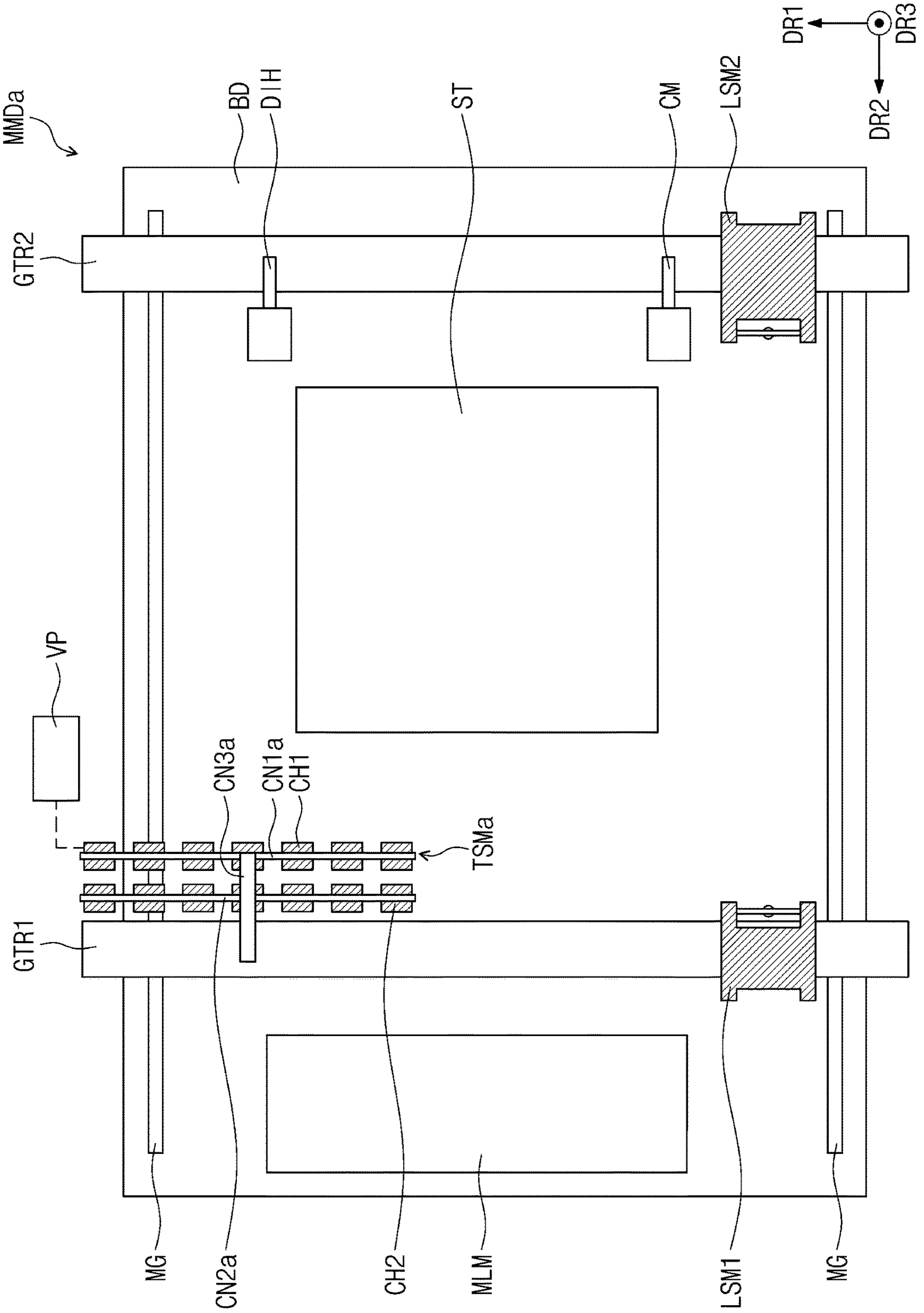
FIG. 13 is a schematic plan view of an apparatus of manufacturing a mask assembly according to an embodiment.

FIG. 13 is a schematic plan view of a mask assembly manufacturing apparatus MMDa according to an embodiment. In FIG. 13, the same reference numerals denote the same elements in FIG. 1, and thus, detailed descriptions of the same elements may be omitted.

Referring to FIG. 13, an arrangement of first chucks CH1 and second chucks CH2 of a tensioner TSMa may be different from that of the tensioner TSM of FIG. 1. The first chucks CH1 may be connected to each other by a first connection unit CN1*a*, and the second chucks CH2 may be connected to each other by a second connection unit CN2*a*. The first connection unit CN1*a* and the second connection unit CN2*a* may be connected to each other by a third connection unit CN3*a*. The first connection unit CN1*a* and the second connection unit CN2*a* may be arranged in the second direction DR2 and may be spaced apart from each other, however, a first gantry GTR1 may not be disposed between the first connection unit CN1*a* and the second connection unit CN2*a*.

Figure 14:
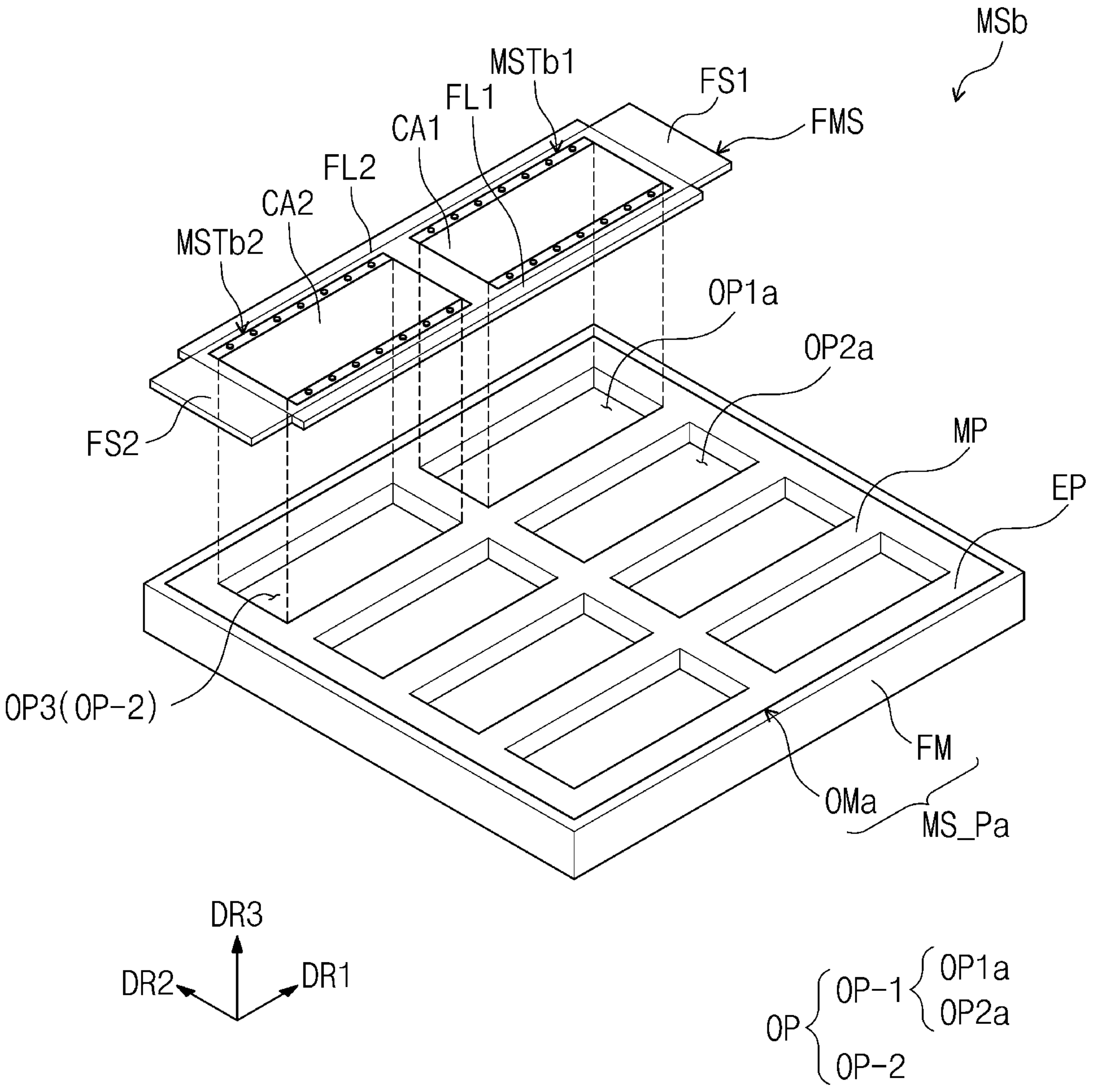
FIG. 14 is a schematic perspective view to explain a process of a manufacturing process of a mask assembly according to an embodiment.

FIG. 14 is a schematic perspective view to explain a portion of a manufacturing process of a mask assembly according to an embodiment. In FIG. 14, the same reference numerals denote the same elements in FIGS. 3A, 3B, and 10, and thus, detailed descriptions of the same elements may be omitted.

Referring to FIG. 14, the mask assembly MSb may include a preliminary mask assembly MS_Pa and a fine metal mask stick FMS coupled with the preliminary mask assembly MS_Pa. The fine metal mask stick FMS may be provided in plural and may cover openings OP defined through an open mask OMa of the preliminary mask assembly MS_Pa.

The fine metal mask stick FMS may include a first long side area FL1 and a second long side area FL2, which extend in the direction parallel to the first direction DR1, and a first short side area FS1 and a second short side area FS2, which extend in the direction parallel to the second direction DR2. The fine metal mask stick FMS may be provided with cell areas CA1 and CA2 defined therethrough. The cell areas CA1 and CA2 may include a first cell area CA1 and a second cell area CA2. The cell areas CA1 and CA2 may correspond to the openings OP of the open mask OMa. As an example, the first cell area CA1 may correspond to a first opening OP1*a*, and the second cell area CA2 may correspond to a third opening OP3.

FIG. 14 shows a structure in which one fine metal mask stick FMS is coupled with two unit masks MSTb1 and MSTb2 and one fine metal mask stick FMS is disposed to overlap two openings OP1*a* and OP3 of the open mask OMa as a representative example. As an example, one fine metal mask stick FMS may be coupled with one unit mask MSTb1, and one fine metal mask stick FMS may overlap one opening of the open mask OMa.

Each of the unit masks MSTb1 and MSTb2 may be tensioned in the cell unit and may be welded to the first and second cell areas CA1 and CA2 of the fine metal mask stick FMS. As an example, the first unit mask MSTb1 may be tensioned and welded to the first cell area CA1 of the fine metal mask stick FMS, and the second unit mask MSTb2 may be tensioned and welded to the second cell area CA2 of the fine metal mask stick FMS. The processes of tensioning and welding the unit masks MSTb1 and MSTb2 in the cell unit may be performed by the mask assembly manufacturing method described with reference to FIGS. 2 to 8.

The mask assembly manufacturing apparatus MMD (refer to FIG. 1) may tension the first and second long side areas FL1 and FL2 and the first and second short side areas FS1 and FS2 of the fine metal mask stick FMS to which the unit masks MSTb1 and MSTb2 are welded using the tensioner TSM (refer to FIG. 1), and the first and second long side areas FL1 and FL2 and the first and second short side areas FS1 and FS2 may be coupled with the preliminary mask assembly MS_Pa. As an example, the mask assembly manufacturing apparatus MMD may tension the first and second long side areas FL1 and FL2 in the second direction DR2 and may combine the first and second long side areas FL1 and FL2 with the preliminary mask assembly MS_Pa or may tension the first and second short side areas FS1 and FS2 in the first direction DR1 and may combine the first and second short side areas FS1 and FS2 with the preliminary mask assembly MS_Pa. The mask assembly manufacturing apparatus MMD may tension the first and second long side areas FL1 and FL2 and the first and second short side areas FS1 and FS2 and may combine the first and second long side areas FL1 and FL2 and the first and second short side areas FS1 and FS2 with the preliminary mask assembly MS_Pa.

The first long side area FL1 of the fine metal mask stick FMS to which the unit masks MSTb1 and MSTb2 are welded may be welded to and coupled with an intermediate portion MP of the open mask OMa, and the second long side area FL2 of the fine metal mask stick FMS to which the unit masks MSTb1 and MSTb2 are welded may be welded to and coupled with an edge portion EP of the open mask OMa. The first and second short side areas FS1 and FS2 of the fine metal mask stick FMS may be welded to and coupled with the edge portion EP of the open mask OMa.

Although the embodiments have been described, it is understood that the disclosure should not be limited to these embodiments but various changes and modifications can be made by one of ordinary skill in the art within the spirit and scope of the disclosure and as hereinafter claimed. Therefore, the disclosed subject matter should not be limited to any single embodiment described herein, and the scope of the disclosure shall be determined according to the attached claims.

What is claimed is:

1. An apparatus of manufacturing a mask assembly, comprising:

a stage on which a preliminary mask assembly comprising an open mask and a frame combined with the open mask are disposed, the open mask including a first opening and a second opening; and a tensioner tensioning a unit mask in a second direction, the unit mask comprising a cell area including deposition openings and a holding area extending from the cell area, wherein:

the tensioner comprises a first chuck extending in the first direction and a second chuck extending in the first direction and spaced apart from the first chuck in the second direction, the apparatus further comprises a vacuum pump connected to the first chuck and the second chuck, the cell area has a first width parallel to the second direction and a second width parallel to a first direction intersecting the second direction, the second width is greater than the first width, each of the first chuck and the second chuck comprises a suction-holding part and a connection part connecting the suction-holding part and the vacuum pump, and the suction-holding part comprises a vacuum pressure distribution space inside of the suction-holding part and connected to the vacuum pump and suction holes extending from the vacuum pressure distribution space and defined in a lower surface of the suction-holding part.

2. The apparatus of claim 1, wherein the open mask comprises an edge portion corresponding to the frame and an intermediate portion extending from the edge portion and disposed between the first opening and the second opening of the open mask, and the stage comprises a fixing part that fixes the intermediate portion.

3. The apparatus of claim 2, wherein the fixing part comprises a first fixing part and a second fixing part, the first fixing part overlaps the intermediate portion in a plan view, the second fixing part overlaps the second opening of the open mask in a plan view, and the second fixing part is turned off in case that the first fixing part is turned on.

4. The apparatus of claim 3, wherein each of the first fixing part and the second fixing part extends in the first direction, and the first fixing part and the second fixing part are spaced apart from each other in the second direction.

5. The apparatus of claim 1, further comprising:

a first gantry connected to the tensioner; and a first laser part connected to the first gantry, wherein the first gantry and the tensioner move to allow the cell area of the unit mask to overlap the first opening of the open mask in a plan view.

6. The apparatus of claim 5, further comprising:

a second gantry spaced apart from the first gantry in the first direction; and a second laser part connected to the second gantry, wherein one of the first laser part and the second laser part welds the unit mask to the open mask, and the other of the first laser part and the second laser part cuts the holding area of the unit mask.

7. The apparatus of claim 6, wherein at least one of the first laser part and the second laser part removes a welding point or a residue of the welding point remaining in the open mask.

8. The apparatus of claim 6, further comprising:

a camera part connected to the second gantry.

9. A method of manufacturing a mask assembly, comprising:

placing a preliminary mask assembly comprising an open mask including a first opening and a second opening, and a frame combined with the open mask on a stage;

placing a unit mask comprising a cell area including deposition openings and a holding area adjacent to the cell area on the first opening of the open mask; and welding the unit mask to the open mask, wherein the holding area comprises a first long side area and a second long side area spaced apart from the first long side area with the cell area disposed between the first long side area and the second long side area, and a tensioner contacting the first long side area and the second long side area to apply a tensile force to the unit mask in a direction that the first long side area and the second long side area move away from each other in the placing of the unit mask, wherein:

the open mask comprises an edge portion corresponding to the frame and an intermediate portion extending from the edge portion and disposed between the first opening and the second opening, the stage comprises a first fixing part overlapping the intermediate portion in a plan view and a second fixing part overlapping the second opening of the open mask in a plan view, and the placing of the preliminary mask assembly comprises fixing the intermediate portion using the first fixing part that is turned on while the second fixing part is turned off.

10. The method of claim 9, wherein the welding of the unit mask to the open mask comprises:

irradiating a laser beam to an area overlapping the intermediate portion of the open mask in a plan view between the first long side area contacting the tensioner and the first opening of the open mask using a laser part to form a first welding point; and irradiating a laser beam to an area overlapping the edge portion of the open mask in a plan view between the second long side contacting the tensioner and the first opening of the open mask using the laser part to form a second welding point.

11. The method of claim 10, further comprising:

cutting a portion of the unit mask, wherein the cutting of the portion of the unit mask comprises:

irradiating a laser beam to an area between the first long side area contacting the tensioner and the first welding point using the laser part; and irradiating a laser beam to an area between the second long side area contacting the tensioner and the second welding point using the laser part.

12. The method of claim 9, further comprising:

repairing the mask assembly, wherein the repairing of the mask assembly comprises:

removing a first welding point and a second welding point using a laser part;

separating the unit mask from the open mask;

placing a replacement unit mask on the open mask; and welding the replacement unit mask to an area of the open mask spaced apart from areas of the open mask from which the first welding point and the second welding point are removed.

13. A method of repairing a mask assembly, comprising:

preparing a mask assembly comprising a frame including a frame opening, an open mask covering the frame opening and including openings, and unit masks each connected to the open mask by welding points and corresponding to the openings;

removing the welding points of a defective unit mask among the unit masks using a laser part;

separating the defective unit mask from the open mask;

placing a replacement unit mask in an opening from which the defective unit mask is removed among the openings of the open mask; and welding the replacement unit mask to an area spaced apart from areas from which the welding points are removed to combine the replacement unit mask with the open mask.

14. A mask assembly comprising:

a frame including a frame opening;

an open mask covering the frame opening and including:

a first opening and a second opening;

an edge portion corresponding to the frame; and an intermediate portion extending from the edge portion and disposed between the first opening and the second opening; and a unit mask comprising a cell area overlapping the first opening in a plan view and including deposition openings, wherein the cell area has a first width parallel to a second direction and a second width parallel to a first direction intersecting the second direction and greater than the first width, and the unit mask and the open mask are connected to each other by welding points arranged along the first direction.

15. The mask assembly of claim 14, wherein the cell area of the unit mask is connected to the open mask while being tensioned in a range of about 0.01% to about 0.03% in the first direction.

16. The mask assembly of claim 14, wherein the welding points do not overlap an edge of a short side extending in the second direction of the unit mask in a plan view.

17. The mask assembly of claim 14, wherein the open mask further includes a third opening, the second opening is spaced apart from the first opening in the second direction, and the third opening is spaced apart from the first opening in the second direction.

* * * * *